(12) United States Patent
Hyobu

(10) Patent No.: US 7,854,327 B2
(45) Date of Patent: Dec. 21, 2010

(54) LOADING TRAY AND THIN PLATE CONTAINER

(75) Inventor: Yukihiro Hyobu, Tokyo (JP)

(73) Assignee: MIRAIAL Co., Ltd., Tokyo (JP)

( * ) Notice: Subject to any disclaimer, the term of this patent is extended or adjusted under 35 U.S.C. 154(b) by 308 days.

(21) Appl. No.: 12/085,369

(22) PCT Filed: Nov. 28, 2006

(86) PCT No.: PCT/JP2006/323661

§ 371 (c)(1),
(2), (4) Date: May 22, 2008

(87) PCT Pub. No.: WO2007/066536

PCT Pub. Date: Jun. 14, 2007

(65) Prior Publication Data

US 2009/0038987 A1    Feb. 12, 2009

(30) Foreign Application Priority Data

Dec. 5, 2005    (JP) .............................. 2005-350744

(51) Int. Cl.
    *B65D 85/00* (2006.01)
(52) U.S. Cl. .................. 206/710; 206/454; 206/509
(58) Field of Classification Search .................. 206/710, 206/711, 712, 454, 455, 503, 509, 303, 445, 206/449, 307, 308.1, 309, 499, 516; 211/41.18; 220/23.6
    See application file for complete search history.

(56) References Cited

U.S. PATENT DOCUMENTS

| | | | |
|---|---|---|---|
| 3,552,548 A * | 1/1971 | Wallestad et al. ............ 206/710 |
| 3,672,495 A * | 6/1972 | Bauer et al. .................. 206/712 |
| 3,695,424 A * | 10/1972 | Cristy et al. ................. 206/455 |
| 3,719,273 A * | 3/1973 | Abe ............................ 206/712 |
| 5,314,068 A * | 5/1994 | Nakazato et al. ............. 206/454 |
| 5,492,223 A * | 2/1996 | Boardman et al. ........... 206/710 |
| 5,544,751 A * | 8/1996 | Klodt et al. .................. 206/509 |
| 6,837,374 B2 * | 1/2005 | Nigg et al. ................... 206/454 |
| 2001/0023839 A1 * | 9/2001 | Kunii et al. .................. 206/711 |
| 2003/0085139 A1 * | 5/2003 | Loritz ...................... 206/308.1 |

FOREIGN PATENT DOCUMENTS

| | | |
|---|---|---|
| JP | 63-138984 | 6/1988 |
| JP | 10-050815 | 2/1998 |
| JP | 2002-104575 | 4/2002 |
| JP | 2004-273867 | 9/2004 |

* cited by examiner

*Primary Examiner*—J. Gregory Pickett
(74) *Attorney, Agent, or Firm*—Bacon & Thomas PLLC

(57) ABSTRACT

A loading tray 13 supports at least one thin plate safely and reliably. It comprises a first loading portion 18, provided on one side thereof, on which at least one thin plate is loaded; a second loading portion 19, provided on the other side thereof, fitted to the first loading portion 18 of adjacent loading tray 13 to form a housing space sealed off from the external environment, for sandwiching the thin plate within the housing space, and for loading the thin plate on the loading tray when the loading tray is placed upside-down; a hook 30, provided on one side thereof, for coupling with an adjacent loading tray 13; and a hook locking mechanism 31, provided on the other side thereof, for coupling with the hook 30 of an adjacent loading tray 13. As many loading trays 13 as the number of the thin plate is stacked to constitute a thin plate container 11. The thin plate container 11 can support the thin plate from both upper and lower sides.

24 Claims, 10 Drawing Sheets

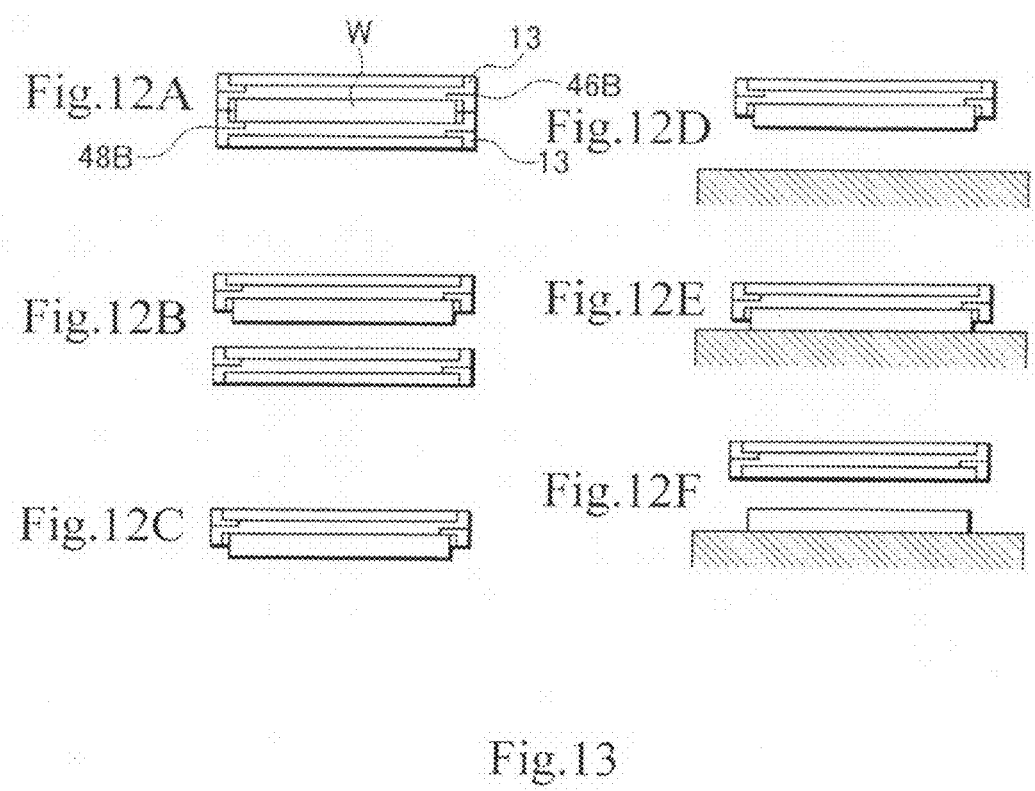

LOADING TRAY AND THIN PLATE CONTAINER

TECHNICAL FIELD

The present invention relates to a loading tray and a thin plate container for supporting thin plates for electronic devices such as semiconductor wafers, magnetic recording medium disks, optical recording medium disks, glass substrates for liquid crystal panels, film substrates for flexible display apparatuses, and so on for carriage, storage, processing, etc.

BACKGROUND ART

Recently, there is a demand for further thinning of a thin plate for an electronic device such as a semiconductor wafer, etc. Thus, each thin plate gets extremely thin and is easy to break regardless of its dimension.

Also, even in a case where the plate thickness does not change, enlargement of the external diameter leads to a thin-plate trend relatively from the viewpoint of the ratio between the plate thickness and the external diameter.

As a container for housing, storing, and loading such an extremely thin plate, a multistage type housing cassette described in Reference Document 1 is known. This multistage type housing cassette is a housing cassette that can load an extremely thin wafer having a thickness of 20 to 100 micrometers without causing chipping on its circumferential surface and without causing a suction error to a pad. Specifically, as shown in FIG. 20, it is a multistage type housing cassette 6 arranging vertically in parallel via braces 5 to be spaced equally a plurality of housing shelves 2 in each of which a semicircular guide 4 having a slightly larger diameter than the diameter of an extremely thin wafer w stands from a flat plate 3. A suction pad of a carrier robot is moved over the upper surface of the wafer w and is then lowered and thrusts the wafer on the flat plate to eliminate warpage of the wafer, and thereafter the wafer is attracted by suction and constrained to the suction pad.

Patent Document 1: Japanese patent publication No. 2004-273867

DISCLOSURE OF THE INVENTION

Problems to be Solved by the Invention

Meanwhile, in the aforementioned multistage type housing cassette 6, the rim portion of the extremely thin wafer w is just supported from its lower side, and no means for reliably constraining the extremely thin wafer w is particularly provided. Accordingly, since the extremely thin wafer w may be displaced easily and broken when the multistage type housing cassette is inclined, the wafer needs to be carried carefully. As a result, a problem of poor operability at the time of carriage occurs.

Also, along with a recent large-size trend of a glass substrate for liquid crystal, etc., a device has been tested in a state of being inclined in numerous cases, but in the aforementioned multistage type housing cassette, the extremely thin wafer w housed therein cannot be inclined. Thus, there is a problem of not being able to use the aforementioned multistage type housing cassette in testing phases.

Further, there is a case where the extremely thin wafer w is processed not only on its upper side but also on its lower side, in which case a phase in which each extremely thin wafer w is turned upside down at the time of being carried out needs to be provided, and a problem of poor operability occurs.

Means to Solve the Problems

The present invention is provided in view of the above aspects and is a thin plate container suitable for carriage, storage, processing, etc. of an extremely thin plate and is one that has been improved so as to load, store, and process small-sized to large-sized thin plates safely and reliably.

A loading tray according to a first invention is a loading tray for supporting at least one thin plate, comprising a first loading portion, provided on one side thereof, on which at least one thin plate is loaded; a second loading portion, provided on the other side thereof, fitted to the first loading portion of an adjacent loading tray to form a housing space sealed off from the external environment, for sandwiching the thin plate within the housing space, and for loading the thin plate on the loading tray when the loading tray is placed upside-down; a coupling portion, provided on one side thereof, for coupling with an adjacent loading tray; and a coupled portion, provided on the other side thereof, for coupling with the coupling portion of an adjacent loading tray, wherein the thin plates are housed in one or plural housing spaces created by stacking as many pieces thereof as the number of the thin plates, one or plurality of which are to be housed in the housing space and are supported from both upper and lower sides.

With this configuration, a thin plate is loaded on the first loading portion of one loading tray, under which state an adjacent loading tray is stacked, and the coupling portion and the coupled portion are coupled with each other, thus to cause the second loading portion of the upper side loading tray to be fitted to the first loading portion of the lower side loading tray to form the housing space. Accordingly, the thin plate is sandwiched and supported by the first loading portion and the second loading portion within the housing space. As many loading trays as the number of the thin plates are stacked, as many housing spaces as the number of the thin plates are formed, and the thin plates are housed in these housing spaces and are supported from either upper or lower sides.

Since a loading projection portion, provided on either or both of the first loading portion and/or the second loading portion, for thrusting and supporting the thin plate housed in the housing space is provided, the loading projection portion abuts on and thrusts the surface of the thin plate to support the thin plate reliably.

Since the loading projection portion is formed in a web state on an entire loading surface of the first loading portion or the second loading portion so as to contact the thin plate with a minimum area, a web loading projection portion thrusts the thin plate uniformly and supports it.

Since a conduit for communicating a space partitioned by the loading projection portion and the thin plate with the external environment when the loading projection portion and the thin plate abut to each other is provided, air is sucked from outside via the conduit, and the thin plate is adsorbed and constrained to the loading projection portion.

Since the web loading projection portion has communication cutouts communicating with plural spaces partitioned by the loading projection portion and the thin plate when the loading projection portion and the thin plate abut to each other, air in the plural spaces is sucked via the communication cutouts at the time of suction from the outside via the conduit, and the thin plate is adsorbed and constrained to the loading projection portion. In this case, spaces communicated by the communication cutouts may be all or part of the spaces formed by the web loading projection portion. A communication space distributed so as to exert a uniform suction force on the thin plate just has to be formed. An example of such a space is a space communicated entirely. The spaces partitioned by the web loading projection portion may be in a macular fashion or in a doughnut shape.

Since the conduit is constituted by a first conduit for communicating a space formed by the first loading portion and the thin plate with the external environment and a second conduit for communicating a space formed by the second loading portion and the thin plate with the external environment, either or both of the first conduit and/or the second conduit is/are connected to an external suction apparatus to enable selective suction of the spaces. Thus, the thin plate is selectively adsorbed to the first loading portion side or the second loading portion side.

A thin plate container according to a second aspect of the present invention comprises a pair of base trays for engaging with a mechanical apparatus, one or plural loading trays inserted between the base trays for housing a thin plate, and a coupling/releasing means for coupling the loading trays and coupling the base tray with the loading tray and releasing the coupling at an arbitrary position independently from one another, wherein the loading tray is constituted by a first loading portion, provided on one side thereof, on which at least one thin plate is loaded; a second loading portion, provided on the other side thereof, fitted to the first loading portion of an adjacent loading tray to form a housing space sealed off from the external environment, for sandwiching the thin plate within the housing space, and for loading the thin plate on the loading tray when the loading tray is placed upside-down; a coupling portion of the coupling/releasing means, provided on one side thereof, for coupling with an adjacent loading tray or the base tray; and a coupled portion of the coupling/releasing means, provided on the other side thereof, for coupling with the coupling portion of an adjacent loading tray or the base tray, and wherein the thin plates are housed in one or plural housing spaces created by stacking between the pair of base trays as many the loading trays as the number of the thin plates, one or plurality of which are to be housed in the housing space and are supported from either upper or lower sides.

With this configuration, a thin plate is loaded on the first loading portion of one loading tray, under which state an adjacent loading tray is stacked, and the coupling portion and the coupled portion are coupled with each other, thus to cause the second loading portion of the upper side loading tray to be fitted to the first loading portion of the lower side loading tray to form the housing space. Accordingly, the thin plate is sandwiched and supported by the first loading portion and the second loading portion within the housing space. As many loading trays as the number of the thin plates are stacked and are inserted between the pair of upper and lower base trays. As a result, as many housing spaces as the number of the thin plates are formed, and the thin plates are housed in these housing spaces and are supported from either upper or lower sides.

Since a seal material, provided to surround the housing space, for segregating the housing space from the external environment to keep it air-tight is provided, the housing space housing the thin plate can be kept clean.

Since a seal supporting groove for supporting the seal material is formed on one side or the other side of each loading tray, and a seal receiving groove to which the seal material supported in the seal supporting groove abuts to improve air-tightness is formed on the other side or one side of each loading tray, the housing space housing the thin plate can be kept clean.

Since a loading projection portion, provided on either or both of the first loading portion and/or the second loading portion, for thrusting and supporting the thin plate housed in the housing space is provided, the loading projection portion abuts on and thrusts the surface of the thin plate to support the thin plate reliably in the housing space of each of the loading trays inserted and stacked between the base trays.

Since the loading projection portion is formed in a web state on the entire loading surface of the first loading portion and/or the second loading portion so as to contact the thin plate with the minimum area, the web loading projection portion thrusts the thin plate uniformly and supports it in the housing space of each of the loading trays inserted and stacked between the base trays.

Since each loading tray has a conduit for communicating a space partitioned by the loading projection portion and the thin plate with the external environment when the loading projection portion and the thin plate abut to each other, air is sucked from the outside via the conduit of a loading tray out of the loading trays inserted and stacked between the base trays, and the thin plate in the housing space is adsorbed and constrained to the loading projection portion. Thereafter, the loading tray at the arbitrary position is opened by releasing the constraint of the coupling/releasing means to load out the adsorbed and constrained thin plate.

Since the web loading projection portion has communication cutouts for communicating with plural spaces partitioned by the loading projection portion and the thin plate when the loading projection portion and the thin plate abut to each other, air in the plural spaces is sucked via the communication cutouts at the time of suction from the outside via the conduit, and the thin plate is adsorbed and constrained to the loading projection portion.

Since the conduit is constituted by a first conduit for communicating a space formed by the first loading portion and the thin plate with the external environment and a second conduit for communicating a space formed by the second loading portion and the thin plate with the external environment, either or both of the first conduit and/or the second conduit is/are connected to an external suction apparatus to enable selective suction of the spaces. Thus, the thin plate is selectively adsorbed to the first loading portion side or the second loading portion side.

Since the conduit has, inside an outer opening end, a flexible tubular body for air-tight connection to a connection tube on the external apparatus, a filter can be inserted into and constrained to this flexible tubular body.

Since a position from an outer opening on the loading surface side of each loading tray to an inner opening on the external environment in the conduit is attached with at least one air cleaning filter, the housing space can be kept in a clean state.

Since a position from an outer opening on the loading surface side of each loading tray to an inner opening on the external environment in the conduit is attached with at least one air cleaning filter, and the air cleaning filter is constituted by a pair of dust filters and a chemical filter sandwiched and provided between the pair of dust filters, chemical substances as well as dust can be eliminated.

Using membrane filters as the aforementioned dust filters enables the dust filters to constitute a compact air cleaning filter with the chemical filter inbetween.

Each loading tray has a wireless tag recording management information on either or both of the loading tray itself and/or the thin plate supported on the loading tray, thus to enable easy management of which loading tray contains what even when plural loading trays are stacked.

The loading tray has a barcode recording various kinds of management information on either or both of the loading tray itself and/or the thin plate supported on the loading tray, thus to enable easy management of which loading tray contains what even when plural loading trays are stacked.

An infopad for displaying various kinds of management information on the base tray is formed on the base tray, so that the base tray can be managed easily.

By forming the loading tray by an ESD (electrostatic discharge) or conductive polymer, attachment of dust can be prevented.

Since the loading tray consists of the loading portion and a loading tray main body for supporting the loading portion from its circumference, the loading portion and the loading tray main body are made of different materials from each other, and at least the loading tray main body is made of an ESD or conductive polymer, attachment of dust can be prevented.

Since the loading portion is made of a softer and more flexible polymer than the thin plate, the thin plate is prevented from being damaged or broken.

Since part or entirety of the loading portion is made of a transparent polymer, the state of the thin plate housed in the housing space can be checked.

Since at least part of the loading tray is made of a transparent polymer, the state of the thin plate housed in the housing space can be checked.

Effect of the Invention

As described above in detail, the loading tray and the thin plate container of the present invention exert the following effects.

With the loading tray according to the first invention, since the housing spaces are formed by stacking the plural loading trays, and the thin plate is sandwiched and supported in each of the housing spaces by the first loading portion and the second loading portion, and the thin plates are housed in these housing spaces and are supported reliably even when the loading tray is placed upside-down, the thin plates can be carried safely.

Since the loading projection portion is provided on either or both of the first loading portion and/or the second loading portion and thrusts and supports the thin plate housed in the housing space, the thin plate can be supported reliably and can be carried safely. After carriage, the loading trays can be separated from one another, and each tray can be used as a tray for carriage.

Since the loading projection portion is formed in a web state on the entire loading surface of the first loading portion and/or the second loading portion to thrust and support the thin plate uniformly, the thin plate can be carried safely. In particular, in a case of a thin and flexible thin plate, it can be supported reliably and can be carried safely.

Since the conduit is provided to each loading tray to suck air from the outside, and the thin plate is adsorbed and constrained to the loading projection portion, the thin plate can be constrained reliably and can be carried safely.

Since the communication cutouts are provided at the web loading projection portion to communicate with plural spaces partitioned by the loading projection portion and the thin plate, and air in the communicated plural spaces is sucked via the conduit to adsorb and constrain the thin plate to the loading projection portion, each space partitioned by the loading projection portion functions as a sucker, and thus the thin plate can be constrained reliably and can be carried safely.

Since the conduit is constituted by a first conduit for communicating a space formed by the first loading portion and the thin plate with the external environment and a second conduit for communicating a space formed by the second loading portion and the thin plate with the external environment, and air is sucked via either or both of the first conduit and/or the second conduit so that the thin plate is selectively adsorbed to the first loading portion side or the second loading portion side, the thin plate can be constrained to either side or both upper and lower sides of the loading tray reliably and can be carried safely.

With the thin plate container according to the second aspect of the present invention, since one or plural loading trays are inserted between the pair of upper and lower base trays, the thin plates are respectively inserted in the housing spaces formed therebetween so that each thin plate is sandwiched and supported by the first loading portion and the second loading portion, and the thin plates are housed in these housing spaces so as to be supported reliably even when the loading tray is placed upside-down, the thin plates can be carried safely. Also, since either one of the respective base trays can be engaged with a mechanical apparatus, the thin plate container can be turned upside down arbitrarily depending on the processing contents by the mechanical apparatus.

Since the seal material for segregating the housing space from the external environment to keep it air-tight is provided, and the housing space for housing the thin plate can be kept clean, the thin plate container can be used for carriage of semiconductor wafers and so on.

Since the seal supporting groove for supporting the seal material and the seal receiving groove to which the seal material supported in the seal supporting groove abuts to improve air-tightness are formed on each loading tray, and the housing space for housing the thin plate can be kept clean, the thin plate container can be used for carriage of semiconductor wafers and so on.

Since the loading projection portion is provided on either or both of the first loading portion and/or the second loading portion and abuts on and thrusts the surface of the thin plate to support the thin plate reliably in the housing space of each of the loading trays inserted and stacked between the base trays, and the loading tray at an arbitrary position is opened by releasing the constraint of the coupling/releasing means to load out the adsorbed and constrained thin plate, the plural thin plates housed in the thin plate container can be loaded in and out individually. Thus, while one thin plate is loaded in and out, the other thin plates have no chance to be exposed in the external environment and can be kept clean.

Since the loading projection portion is formed in a web state on the entire loading surface of the first loading portion or the second loading portion to thrust and support the thin plate uniformly, the plural thin plates housed in the thin plate container can be carried safely. In particular, in a case of a thin and flexible thin plate, it can be supported reliably and can be carried safely.

Since the loading trays each having the conduits for communicating the spaces partitioned by the loading projection portion and the thin plate with the external environment are inserted and stacked between the base trays, air is sucked from the outside via the conduits of any one of the loading trays to adsorb and constrain the thin plate in its housing space to the loading projection portion, and the loading tray at the arbitrary position is opened by releasing the constraint of the coupling/releasing means to load out the adsorbed and constrained thin plate, plural thin plates housed in the thin plate container can be constrained reliably and can be carried safely, and also the thin plate at an arbitrary position can be loaded in/out safely.

Since the communication cutouts are provided at the web loading projection portion to entirely communicate with plural spaces partitioned by the loading projection portion and the thin plate, and all air in the spaces is sucked via the conduits to adsorb and constrain the thin plate to the loading projection portion, each space partitioned by the loading projection portion functions as a sucker, and thus the thin plate loaded on each loading tray of the thin plate container can be constrained reliably and can be carried safely, and also the thin plate at an arbitrary position can be loaded in/out safely.

Since the conduit is constituted by a first conduit for communicating a space formed by the first loading portion and the thin plate with the external environment and a second conduit for communicating a space formed by the second loading portion and the thin plate with the external environment, and air is sucked via either or both of the first conduit and/or the second conduit so that the thin plate is selectively adsorbed to the first loading portion side or the second loading portion side, the thin plate can be constrained to either side or both upper and lower sides of the loading tray reliably and can be carried safely, and also the thin plate at an arbitrary position can be loaded in/out safely.

The inner surfaces of the inner openings opened to the external environment in the conduits are provided with the flexible tubular bodies for air-tight connection to connection tubes on the external apparatus, so that filters can be inserted in and constrained to these flexible tubular bodies, and thus each housing space can be opened to the external environment in a state of keeping the inside clean.

Also, since the flexible tubular bodies on the inner surfaces of the inner openings can couple with the suction nozzles of the processing apparatus in an air-tight manner, effective suction can be performed.

Since a position from an outer opening on the loading surface side of each loading tray to an inner opening on the external environment in the conduit is attached with at least one air cleaning filter, and the housing space can be kept in a clean state, the filter does not have to take much space, and the housing space can be opened to the external environment in a state of keeping a clean state.

Since a position from an outer opening on the loading surface side of each loading tray to an inner opening on the external environment in the conduit is attached with at least one air cleaning filter, and the air cleaning filter is constituted by a pair of dust filters and a chemical filter sandwiched and provided between the pair of dust filters so that chemical substances as well as dust can be eliminated, the filters do not have to take much space, and the housing space can be opened to the external environment in a state of keeping a clean state.

Since using membrane filters as the aforementioned dust filters enables the dust filters to constitute a compact air cleaning filter with the chemical filter inbetween, the filters do not have to take much space, and the housing space can be opened to the external environment in a state of keeping a clean state.

Since each loading tray has a wireless tag recording management information to enable easy management of processing history and so on of the thin plates on the plurally stacked respective loading trays, all the thin plates in the thin plate container can be managed easily.

Since the loading tray has a barcode for recording various kinds of management information to enable easy management of which loading tray contains what even when plural loading trays are stacked, all the thin plates in the thin plate container can be managed easily.

Since the infopad for displaying various kinds of management information on the base tray is formed on the base tray to enable easy management of the base tray, the thin plate container to which this base tray is attached can be managed easily.

Since the loading tray is formed by an ESD or conductive polymer to prevent attachment of dust, the thin plate housed in the housing space can be kept clean.

Since the loading tray consists of the loading portion and a loading tray main body for supporting the loading portion from its circumference, the loading portion and the loading tray main body are made of different materials from each other, and at least the loading tray main body is made of an ESD or conductive polymer, thus to prevent attachment of dust, the thin plate housed in the housing space can be kept clean.

Since the loading portion is made of a softer and more flexible polymer than the thin plate to prevent the thin plate from being damaged or broken, the thin plate housed in the housing space can be carried safely.

Since at least part of the loading tray is made of a transparent polymer to enable check of the state of the thin plate housed in the housing space, the thin plate can be carried safely while the state of the thin plate is checked.

Since part or entirety of the loading portion is made of a transparent polymer to enable check of the state of the thin plate housed in the housing space, the thin plate can be carried safely while the state of the thin plate is checked.

BRIEF DESCRIPTION OF THE DRAWINGS

FIG. 12 is a schematic view showing an operation state of the thin plate container according to the second embodiment of the present invention.

FIG. 13 is a plan view showing a loading tray of a thin plate container according to a third embodiment of the present invention.

DESCRIPTION OF THE SYMBOLS

- 11 thin plate container
- 12 base tray
- 13 loading tray
- 14 coupling/releasing means
- 16 apparatus pin groove
- 18 first loading portion
- 19 second loading portion
- 20 infopad
- 21 grip
- 22 wireless tag
- 23 seal supporting groove
- 24 seal material
- 26 loading projection portion
- 28 seal receiving groove
- 30 hook
- 31 hook locking mechanism
- 32 attachment/detachment operation hole
- 34 hook inserting hole
- 35 snap fastener
- 36 constraining plate portion
- 37 flexible portion
- 38 catch
- 40 operation key
- 42 supporting mechanism
- 43 conduit
- 44 communication cutout
- 45 conduit
- 47 first membrane filter
- 49 second membrane filter
- 51 loading tray
- 52 positioning cut-out
- 53 tray positioning pin
- 54 tray positioning hole
- 55 loading projection portion
- 56 base tray
- 57 apparatus pin groove
- W semiconductor wafer

BEST MODE FOR CARRYING OUT THE INVENTION

Hereinafter, an embodiment of the present invention will be described with reference to the attached drawings. A thin plate container according to the present invention is a container that houses thin plates for electronic devices such as semiconductor wafers, magnetic recording medium disks, optical recording medium disks, glass substrates for liquid crystal, film substrates for flexible display apparatuses, and so on for carriage, storage, and use in processing phases (such as a manufacturing line). In particular, it is a container suitable for use for housing, carriage, etc. of an extremely thin plate. The present embodiment will be described taking a thin plate container for housing an extremely thin semiconductor wafer as an example. Since an extremely thin semiconductor wafer is easy to break regardless of its dimension, the present embodiment can be applied to semiconductor wafers of all kinds of dimensions. Also, it can be applied to a semiconductor wafer or the like that is not extremely thin but is easy to break.

First Embodiment

Figure 1:
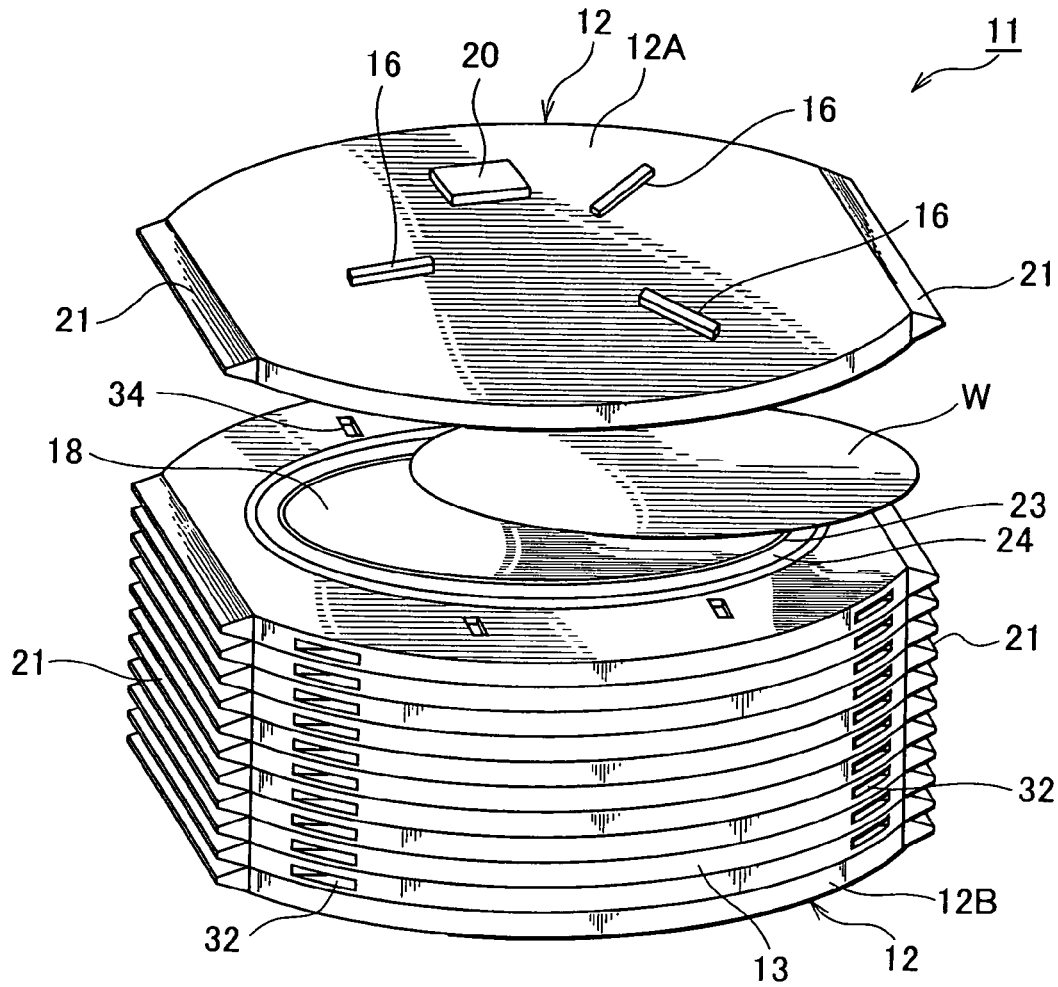
FIG. 1 is a perspective view showing a thin plate container according to a first embodiment of the present invention.

As shown in FIG. 1, a thin plate container 11 is mainly constituted by a pair of base trays 12, loading trays 13 inserted between respective base trays 12, and a coupling/releasing means 14 (refer to FIG. 5) for coupling the adjacent loading trays 13 and coupling the base tray 12 with the loading tray 13 and releasing the coupling.

The base trays 12 are trays that protect the top end surface and the bottom end surface of the plurally stacked loading trays 13 and that are engaged with a mechanical apparatus (not shown) for performing processing such as polishing of a semiconductor wafer W. Each base tray 12 is formed approximately in a disk shape. On the rim of each base tray 12, after-mentioned grips 21 are provided at two positions opposed to each other. The base trays 12 consist of an upper base tray 12A and a lower base tray 12B and are provided at the upper and lower end portions of one or plural stacked loading trays 13. On the upper side of the upper base tray 12A, three apparatus pin grooves 16 to be mechanically coupled with the mechanical apparatus are integrally formed. These three apparatus pin grooves 16 are grooves fitted to kinematic pins (not shown) on the processing apparatus for positioning of the thin plate container 11. These apparatus pin grooves 16 are integrally formed on the lower side of the lower base tray 12B in the same manner as well.

The lower side of the upper base tray 12A is formed in a similar manner to that of an after-mentioned second loading portion 19 on the lower side of the loading tray 13. On the upper side of the lower base tray 12B, a first loading portion similar to an after-mentioned first loading portion 18 on the upper side of the loading tray 13 is provided.

On at least one side of the base tray 12 or a surface of the base tray 12 opposite a side on which the loading tray 13 is located, an infopad 20 for displaying information on the base tray 12 is formed.

The loading tray 13 is a tray inserted between the base trays 12 to house and support a semiconductor wafer W, as shown in FIGS. 2, 3, 5, and 6. The loading tray 13 is formed in a similar shape to that of the base tray 12. The loading tray 13 is constituted by the first loading portion 18, the second loading portion 19, the coupling/releasing means 14, and the grips 21.

Figure 2:
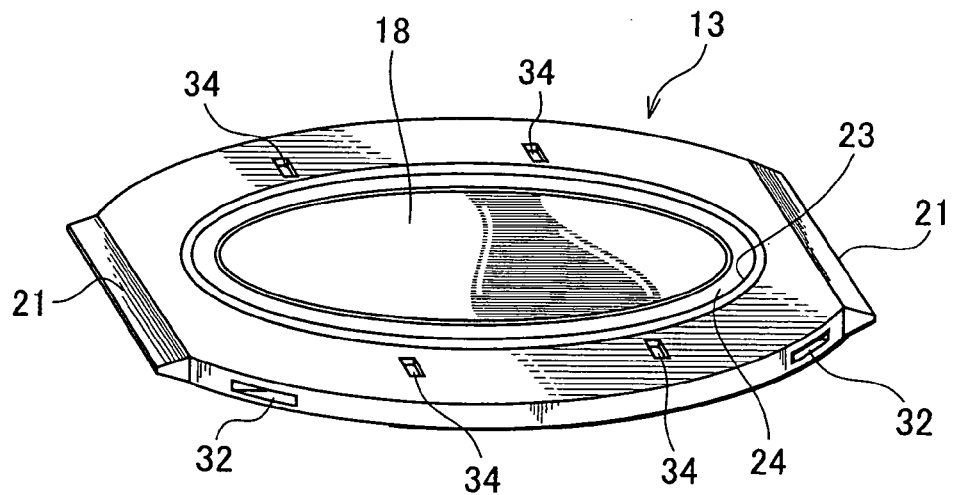
FIG. 2 is a perspective view of a loading tray according to the first embodiment of the present invention shown from a first loading portion side.

The first loading portion 18 is a portion to load a semiconductor wafer W, as shown in FIG. 2. The first loading portion 18 is formed on the upper side of the loading tray 13 to correspond to the size of the semiconductor wafer W. Since the semiconductor wafer W to be loaded on the first loading portion 18 is circular, the first loading portion 18 is formed in a circular shape to correspond to it. For example, it is set to correspond to a semiconductor wafer W with a diameter of 300 mm and a thickness of 50 to 750 micrometers or so. It is noted that a protective film may be attached to the surface of the semiconductor wafer W, in which case the thickness increases as much as the thickness of the protective film. The surface of the first loading portion 18 is formed in a flat surface shape and is adapted to abut on and support the entire lower side of the semiconductor wafer W. Meanwhile, on at least either the first loading portion 18 or the second loading portion 19, a slide prevention structure (not shown) for restricting the semiconductor wafer W within a predetermined position on the loading surface of the tray is formed. Specifically, this slide prevention structure is in a circular or arc shape along the circumferential portion of the semiconductor wafer W and is formed to be stepped or protruded.

On the circumferential rim of the first loading portion 18, a seal supporting groove 23 is provided. This seal supporting groove 23 is a groove for supporting a seal material 24. The seal supporting groove 23 is formed in an annular shape on the circumferential rim of the first loading portion 18. Accordingly, a housing space is formed by the first loading portion 18, second loading portion 19, and seal material 24. The seal material 24 is provided in a state of being fitted in the seal supporting groove 23 to surround the housing space created when two loading trays 13 are stacked and coupled with each other and is adapted to seal off this housing space from the external environment to keep it air-tight. This housing space is set to be large enough to house at least one semiconductor wafer W. The housing space may house two or more semiconductor wafers W at the same time depending on the application. In such a case, the dimension of the housing space is set in accordance with the thickness of the two-ply or more semiconductor wafers W. Specifically, the diameter of the seal material 24 and a hook 30 of the coupling/releasing means 14 are adjusted to set the height of the housing space to correspond to the total thickness of the semiconductor wafers W. Also, a thrusting force with which the first loading portion 18 and the second loading portion 19 thrust the semiconductor wafers W is adjusted by fine-adjusting the length of the hook 30.

Figure 3:
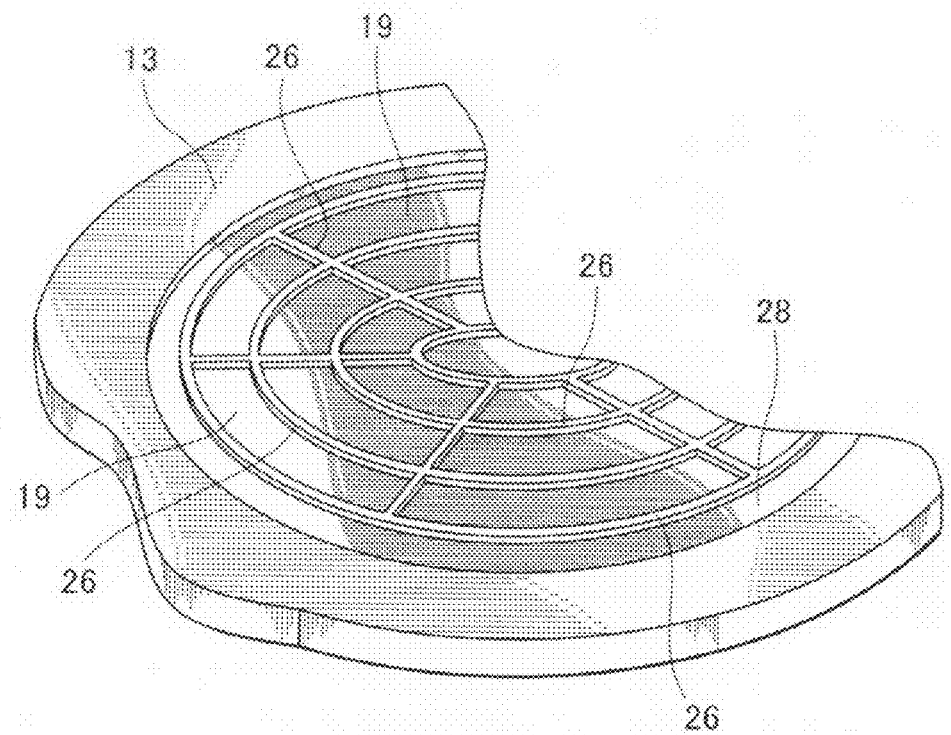
FIG. 3 is a perspective view of the loading tray according to the first embodiment of the present invention shown from a second loading portion side.

The second loading portion 19 is a portion, fitted to the first loading portion 18 of an adjacent loading tray 13 to form the aforementioned housing space sealed off from the external environment, for sandwiching the semiconductor wafer W within the housing space, and for loading and supporting the semiconductor wafer W on the loading tray when the loading tray is placed upside-down, as shown in FIG. 3. The second loading portion 19 houses and supports the semiconductor wafer W loaded on the first loading portion 18 in the aforementioned housing space created by covering it from its upper side. The second loading portion 19 is formed to have the same dimension as that of the first loading portion 18.

On the entire surface of each of the first loading portion 18 and the second loading portion 19, a loading projection portion 26 is provided. This loading projection portion 26 is a member for thrusting and supporting the semiconductor wafer W loaded on the first loading portion 18 from its both sides. The loading projection portion 26 is formed in a web state.

The reason for forming the loading projection portion 26 in a web state is to let the loading projection portion 26 contact the semiconductor wafer W with the minimum area and to thrust the entire surface of the semiconductor wafer W uniformly. Thus, by contacting the semiconductor wafer W with the minimum area and thrusting the entire surface of the semiconductor wafer W uniformly, the web loading projection portion 26 is adapted to sandwich the extremely thin semiconductor wafer W in the housing space between the first loading portion 18 and the second loading portion 19 and support it reliably. It is noted that the drawing is shown in a state where the loading projection portion 26 is omitted on the first loading portion 18 for descriptive purposes because the loading projection portion 26 is not provided on the first loading portion 18 in some cases, but in fact the loading projection portion 26 is provided on the first loading portion 18 as well, as described above. Therefore, the structure and operation of the loading projection portion 26 on the second loading portion 19 described in the present embodiment will be applied to the loading projection portion 26 on the first loading portion 18 as it is.

On the circumferential rim of the second loading portion 19, a seal receiving groove 28 is provided. This seal receiving groove 28 is a portion to which the seal material 24 supported in the seal supporting groove 23 on the first loading portion 18 side is firmly attached to improve air-tightness in the aforementioned housing space.

Figure 5:
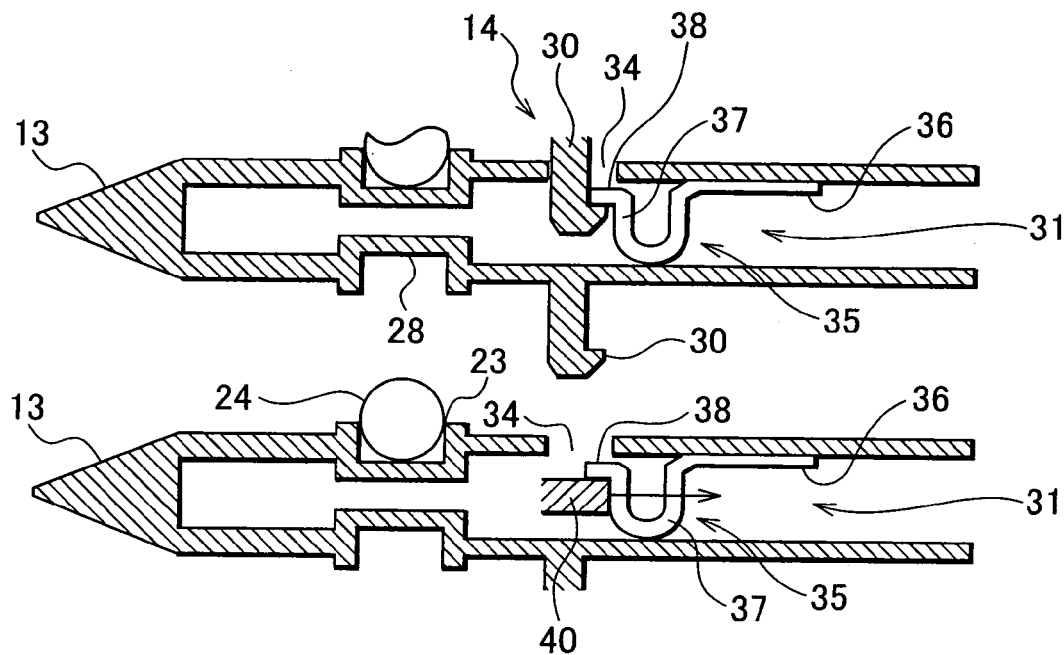
FIG. 5 is an enlarged cross-sectional view of a main part showing a coupling/releasing means of the thin plate container according to the first embodiment of the present invention.
Figure 6:
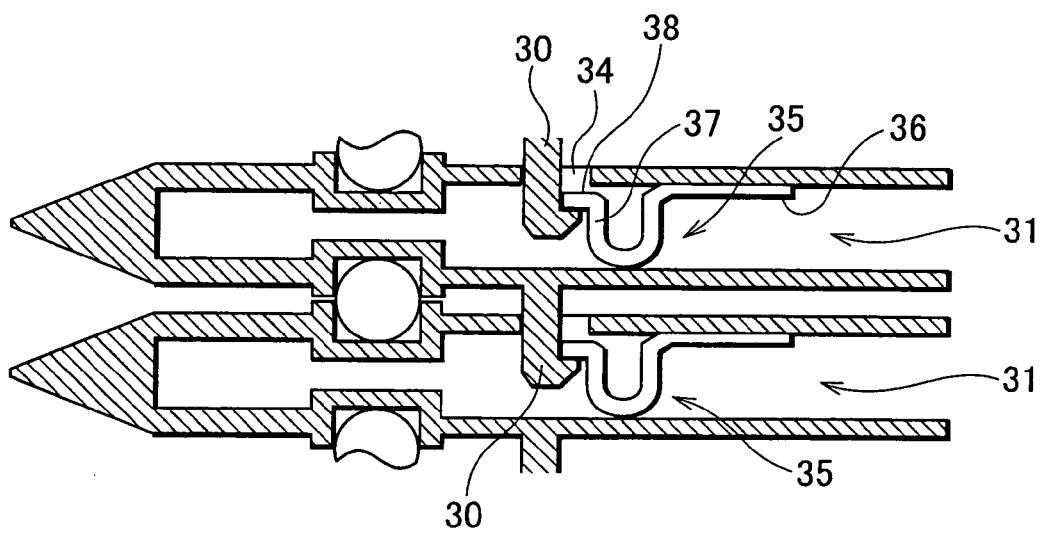
FIG. 6 is an enlarged cross-sectional view of a main part showing the coupling/releasing means of the thin plate container according to the first embodiment of the present invention.

The coupling/releasing means 14 is constituted by the hook 30 as a coupling portion, a hook locking mechanism 31 as a coupled portion, and an attachment/detachment operation hole 32, as shown in FIGS. 2, 5, and 6.

The hook 30 is provided on the lower side of the loading tray 13. Also, this hook 30 is provided at a position to face the hook locking mechanism 31 of a loading tray 13 on the lower side in a state where two loading trays 13 are stacked. In this manner, the two loading trays 13 are stacked, as a result of which the hook 30 is fitted in and locked at the hook locking mechanism 31. The length of the hook 30 is adjusted in accordance with the number (thickness) of the semiconductor wafers W housed in the housing space.

The hook locking mechanism 31 is a mechanism that is provided on the upper side of the aforementioned loading tray 13 and to which the hook 30 is fitted and constrained. This hook locking mechanism 31 is attached inside the loading tray 13. As for the loading tray 13, the circumferential rim side part of the first loading portion 18 and the second loading portion 19 is in a hollow structure, and the hook locking mechanism 31 is built in this hollow part of the loading tray 13. The hook locking mechanism 31 specifically consists of a hook inserting hole 34 and a snap fastener 35. The hook inserting hole 34 is a conduit into which the hook 30 is inserted. The hook inserting hole 34 is formed to correspond to the size of the hook 30. The snap fastener 35 is a member for catching the hook 30. The snap fastener 35 consists of a constraining plate portion 36, a flexible portion 37, and a catch 38. The constraining plate portion 36 is constrained on the ceiling wall in the hollow of the loading tray 13 to support the flexible portion 37 and the catch 38. The side shape of the flexible portion 37 is a U shape. Also, the flexible portion 37 is made of a member with flexibility and is adapted to flex in a state of supporting the catch 38 so as to let the catch 38 appear at and disappear from the hook inserting hole 34. The catch 38 is a member for catching the hook 30 directly and constraining the hook 30. The catch 38 is flexibly supported on the flexible portion 37. Thus, the catch 38 is supported to be movable in the left-right direction in FIGS. 5 and 6 and is supported to be movable from a center of the hook inserting hole 34 to a circumference of the hook inserting hole 34. Accordingly, when the hook 30 is inserted into the hook inserting hole 34, the hook 30 thrusts the catch 38 to the circumferential portion side of the hook inserting hole 34 by the slope of its tip end to cause mutual coupling.

The attachment/detachment operation hole 32 is a conduit into which an operation key 40 (refer to FIG. 5) that attaches/detaches the hook locking mechanism 31 is inserted, as shown in FIG. 2. This attachment/detachment operation hole 32 is formed to open at the outer side of the loading tray 13 so as to communicate the snap fastener 35 with the outside. The operation key 40 is adapted to be inserted into the attachment/detachment operation hole 32 in the horizontal direction from the outer side of the loading tray 13, thrust and shrink the flexible portion 37 of the snap fastener 35, and push away the catch 38 to the circumferential portion of the hook inserting hole 34, to release the constraint of the coupling/releasing means 14.

Figure 4:
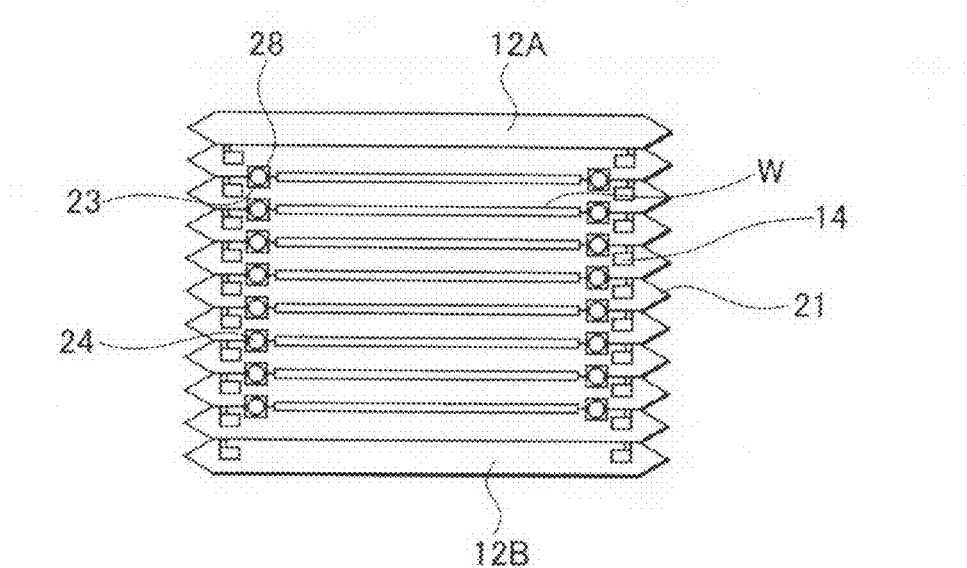
FIG. 4 is a front view showing the thin plate container according to the first embodiment of the present invention.

Accordingly, when the base trays 12 and the loading trays 13 are stacked as shown in FIG. 4, the coupling/releasing means 14 mutually constrains a loading tray 13 to a loading tray 13 and a base tray 12 to a loading tray 13 to be integrated and constitute the thin plate container 11. Further, by inserting the operation key 40 into the attachment/detachment operation hole 32 at an arbitrary position to release the constraint of the coupling/releasing means 14, the base tray 12 and the loading tray 13 can be separated and coupled again at the arbitrary position.

Meanwhile, although an example in which the constraint is released by pushing away the catch 38 with the operation key 40 has been shown in the present embodiment, it is to be understood that the constraint may be released by letting the hook 30 itself flex with the operation key 40. In such a case, as the catch 38 may be in a mechanically firm structure, no structure of the flexible portion 37 or the like is needed. Also, a constraining means having another structure is applicable.

The grip 21 is a portion that a carrier arm on the external mechanical apparatus is fitted to and grips. The grip 21 is provided at each of the opposing sides (left and right sides in FIG. 1) of the loading tray 13 as shown in FIGS. 1, 2, 4, and 7. The vertical cross-section of the grip 21 is formed in a wedge shape. That is, the vertical cross-sectional shape of the grip 21 is structured to have two slope surfaces sloped to each other for positioning in the up-down direction. A supporting mechanism 42 of the aforementioned carrier arm is in a V groove structure. This V groove portion of the supporting mechanism 42 contacts and is mutually fitted to the two slope surfaces of the grip 21 so that the loading tray 13 is positioned in the up-down direction. It is noted that, although the vertical cross-sectional shape of the grip 21 is herein a wedge shape, it may be in a structure other than the wedge shape as long as it is a structure having two slope surfaces sloped to each other for positioning in the up-down direction.

For positioning of the grip 21 in the left-right direction, the both end walls of the grips 21 abut to the end walls of the supporting mechanisms 42.

The loading tray 13 having the above structure is made of an ESD or conductive polymer. Also, the first loading portion 18 and the second loading portion 19 of the loading tray 13 are made of a transparent polymer.

As specific materials of the loading tray 13, thermoplastic polymers such as polycarbonate resin, polybutylene terephthalate resin, polymethyl methacrylate resin, cycloolefin resin, and polypropylene resin, fluorocarbon resin, and so on may be used. A conductive material such as a carbon fiber or metal powder or surfactant may be added to these polymers to give them conductivity or electrostatic property.

As flexible materials, polybutylene terephthalate resin, polyethylene elastomer, and polybutylene elastomer are raised. Also, since most organic polymers are softer than silicon, a softer material than the semiconductor wafer W does not need to be considered to select a material. Meanwhile, although most organic polymers can be used as a material softer than the semiconductor wafer W, it is preferable that polybutylene terephthalate resin or the like, which is a more flexible and softer material than other organic polymers, is used at a portion directly contacting the semiconductor wafer W.

As transparent materials, polycarbonate resin, polymethyl methacrylate resin, cycloolefin resin, and so on are raised.

Meanwhile, a different kind of polymer from the polymer satisfying the above flexibility, ESD property, and conductivity functions may be used. In such a case, only the first loading portion 18 and the second loading portion 19 of the loading tray 13 or part of them shall be made of a transparent polymer. Only the loading tray 13 or part of it may be made of a transparent polymer.

The loading tray 13 has a wireless tag 22 as information recording/replaying means. This wireless tag 22 is attached to a surface on the more external environment than the position of the seal material 24 of the loading tray 13. In the wireless tag 22, information on the loading tray 13 or information on the semiconductor wafer W housed therein, or both of them are recorded. The wireless tag 22 may be a read-only tag or a readable/writable tag. Either one shall be selected depending on the application. Also, the attachment position of the wireless tag 22 may be on the upper side, outer side, or lower side of the loading tray 13. Any position is acceptable as long as the wireless tag 22 can communicate with an external apparatus that reads from and writes in the wireless tag at the position. Instead of the wireless tag 22, a barcode for recording the same information as above may be provided as an information recording/replaying means.

[Operation]

The thin plate container configured as above is used in the following manner.

First, as many loading trays 13 as the number of the semiconductor wafers W to be supported are prepared. Subsequently, each semiconductor wafer W is loaded on the first loading portion 18 of each loading tray 13, and information on each loading tray 13 and each semiconductor wafer W is recorded in each wireless tag 22. Also, the aforementioned information in each wireless tag 22 is recorded in a control section for controlling the entire apparatus, as needed. Thereafter, all the loading trays 13 are stacked. This leads to a state in which the hook 30 of the coupling/releasing means 14 is inserted in the hook inserting hole 34 of the hook locking mechanism 31.

In this state in which the loading trays 13 are stacked, the loading trays 13 are thrust to one another. By doing so, the hook 30 pushes aside the catch 38 of the snap fastener 35 and is inserted into the hook inserting hole 34, and the hook 30 and the catch 38 are engaged with and constrained to each other. Alternatively, the operation key 40 is inserted from the attachment/detachment operation hole 32 to move the catch 38 of the snap fastener 35 to the circumferential portion of the hook inserting hole 34 and to drop down the hook 30 of the upper side loading tray 13, and the hook 30 and the catch 38 are engaged with and constrained to each other.

Consequently, the semiconductor wafer W loaded on the first loading portion 18 of each loading tray 13 is sealed off from the external environment as a housing space is formed by the second loading portion 19 of the upper side loading tray 13, the aforementioned first loading portion 18, and the seal material 24. Also, the semiconductor wafer W is thrust by the loading projection portion 26 of the second loading portion 19 and is sandwiched and supported firmly by this loading projection portion 26 and the first loading portion 18.

In addition, the base trays 12 are attached to the upper and lower sides end portions of the plurally stacked loading trays 13. That is, the upper base tray 12A and the lower base tray 12B are attached to the upper side and the lower side of the loading trays 13, respectively by the coupling/releasing means 14. Information in the infopad 20 of the base tray 12 is recorded in the aforementioned control section. It is noted that, although the upper base tray 12A and the lower base tray 12B are attached after the plural loading trays 13 have been stacked, they may be stacked at the same time as the loading trays 13 in some cases.

Accordingly, the thin plate container 11 is constituted.

After one thin plate container 11 is constituted, the thin plate container 11 is carried. In a case where the number of the semiconductor wafers W to be carried in the following time is less or more than the number of the loading trays 13 in the previous-time thin plate container 11, a measure is taken by adjusting the number of the loading trays 13 depending on the case.

Next, the thin plate container 11 is carried to a place in accordance with the processing contents of the semiconductor wafers W contained therein. This thin plate container 11 is carried and thereafter is loaded on a loading table 32 of the mechanical apparatus. At this time, the apparatus pin grooves 16 of the base tray 12 are fitted to the kinematic pins on the mechanical apparatus, and the thin plate container 11 is loaded at an accurate position.

Figure 7A:
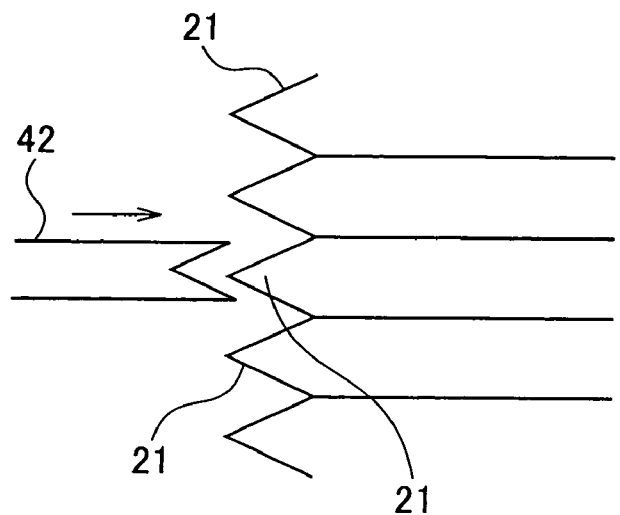
FIG. 7 is a schematic view showing a coupling state between a grip of the thin plate container according to the first embodiment of the present invention and a supporting mechanism of an external apparatus.
Figure 7B:
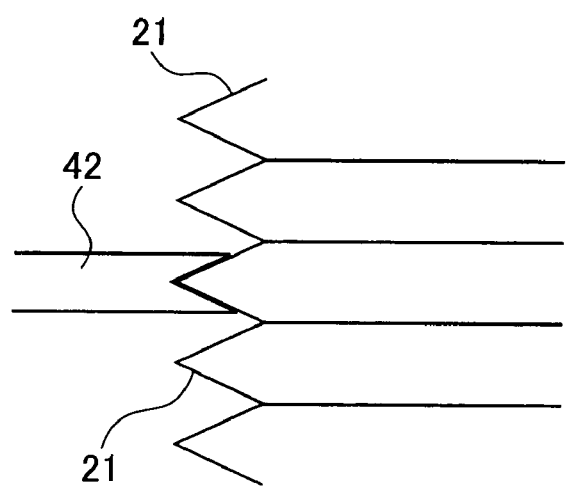
Figure 7C:
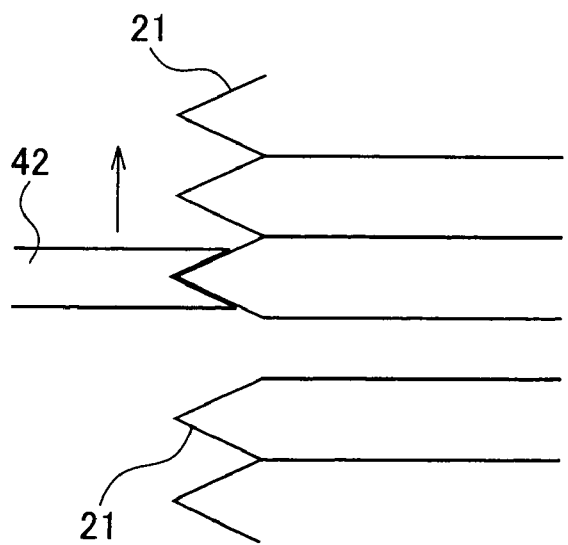

Next, as shown in FIGS. 7 (A) and 7 (B), the two supporting mechanisms 42 on the mechanical apparatus are respectively fitted to the grips 21 of the loading tray 13 to grip the loading tray 13 for supporting a semiconductor wafer W to be processed. In this manner, the loading tray 13 is positioned in the up-down direction by the wedge-shaped grips 21 and the V grooves of the supporting mechanisms 42 and in the left-right direction by the both end walls of the grips 21 and the end walls of the supporting mechanisms 42.

Next, the operation key 40 is moved to the position of the loading tray 13 and is inserted into the attachment/detachment operation hole 32 to release the constraint of the coupling/releasing means 14, and the loading tray 13 is separated as shown in FIG. 7 (C).

Next, the loading tray 13 gripped by the supporting mechanisms 42 is lifted up to open the thin plate container 11.

Next, a loading-in/out mechanism (not shown) on the mechanical apparatus supports and lifts up the semiconductor wafer W and carries it outside for processing. After the semiconductor wafer W has been carried out, it stands by as it is. As the need arises, the lifted loading tray 13 is returned, and the hook 30 is inserted into the hook inserting hole 34 of a lower side loading tray 13 and is thrust inside for mutual coupling.

In a case where the processed semiconductor wafer W is housed in the thin plate container 11, the semiconductor wafer W supported by the taking-in/out mechanism is loaded on the first loading portion 18. In a case where the loading trays 13 are coupled, the loading tray 13 at a position to which the semiconductor wafer W is intended to be returned is separated in the same manner as above and is lifted up by the supporting mechanisms 42, and thereafter the semiconductor wafer W is loaded.

Thereafter, the loading tray 13 lifted up by the supporting mechanisms 42 is put down to insert the hook 30 into the hook inserting hole 34 and thrust inside. This is the end of housing the semiconductor wafer W.

In a case where a semiconductor wafer W at another position is processed, a loading tray 13 at the position is separated in the same manner as above, and the semiconductor wafer W contained therein is loaded out for processing.

In a case where the opposite surface of the semiconductor wafer W is to be processed, the thin plate container 11 is loaded on the mechanical apparatus after it is turned upside down, and thereafter the above processing is performed.

[Effect]

Accordingly, the thin plate container 11 exerts the following effects.

Since the first loading portion 18 and the second loading portion 19 are provided to the loading tray 13 to sandwich and support the semiconductor wafer W from the upper and lower sides, the semiconductor wafer W can be carried safely. In particular, since the semiconductor wafer W is sandwiched and supported from the upper and lower sides, the semiconductor wafer W can be supported reliably without being displaced even when the thin plate container 11 is turned upside down and can be carried safely.

Since the loading projection portion 26 is disposed on the second loading portion 19 of the loading tray 13 to thrust and support the semiconductor wafer W loaded on the first loading portion 18, the semiconductor wafer W can be supported reliably and can be carried safely.

After carriage, the thin plate container 11 can be divided into the loading trays 13, and each tray can be used as a tray for loading each semiconductor wafer W individually. It can also be used as a tray for operation. Thus, the thin plate container 11 and the loading tray 13 can be used for several kinds of embodiments.

Also, since the loading projection portion 26 is formed in a web state on the entire loading surface of the second loading tray 19 to thrust and support the semiconductor wafer W uniformly, the semiconductor wafer W can be supported reliably and can be carried safely. In particular, in a case of a thin, flexible, extremely-thin semiconductor wafer W, the extremely thin semiconductor wafer W is sandwiched and supported from its both sides, and thus it can be supported reliably and can be carried safely.

The apparatus pin grooves 16 are provided on the upper and lower base trays 12 of the thin plate container 11 and can be fitted to the kinematic pins of the mechanical apparatus even when the thin plate container 11 is turned upside down, and thus even in a case where the thin plate container 11 needs to be turned upside down depending on the processing contents of the semiconductor wafer W, etc., the case can be dealt with by turning the thin plate container 11 upside down. That is, by turning the thin plate container 11 upside down between a phase for processing one side of the semiconductor wafer W and a phase for processing the other side, there is no need to turn the semiconductor wafer W individually in the processing phases, and the operability is improved.

Since the seal material 24 is provided to seal off the housing space formed between the first loading portion 18 and the second loading portion 19 from the external environment to keep it air-tight, the aforementioned housing space for housing the semiconductor wafer W can be kept clean, which enables the thin plate container 11 to be appropriate for loading the semiconductor wafer W.

Since the seal supporting groove 23 for supporting the seal material 24 and the seal receiving groove 28 to which the seal material 24 supported by this seal supporting groove 23 abuts for improvement of air-tightness are formed on each loading tray 13, the aforementioned housing space can be kept clean, which enables the thin plate container 11 to be appropriate for transferring the semiconductor wafer W.

Since the loading tray 13 is equipped with the wireless tag 22 or the barcode as an information recording/replaying means recording various management information to enable easy management of which loading tray 13 contains what even when plural loading trays 13 are stacked, all the semiconductor wafers W in the thin plate container 11 can be managed easily. As a result, the efficiency of carriage and processing of the semiconductor wafers W can be promoted.

Also, the infopad 20 for displaying various kinds of management information on this base tray 12 is formed on the base tray 12, so that each base tray 12 can be managed easily, and thus the thin plate container 11 to which this base tray 12 is attached can be managed easily. As a result, the efficiency of carriage and processing of the semiconductor wafers W can be promoted.

By forming the loading tray 13 by an ESD or conductive polymer, attachment of dust can be prevented, and thus the semiconductor wafer W housed in the aforementioned housing space can be kept clean.

Since each of the first loading portion 18 and the second loading portion 19 is made of a softer and more flexible polymer than the semiconductor wafer W to prevent the semiconductor wafer W from being damaged or broken, the semiconductor wafer W housed in the aforementioned housing space can be carried safely without being damaged.

Since at least part of the loading tray 13 is made of a transparent polymer to enable check of the state of the semiconductor wafer W housed in the aforementioned housing space, the semiconductor wafer W can be carried safely while the state of the semiconductor wafer W is checked.

Since part or entirety of the first loading portion 18 and the second loading portion 19 is made of a transparent polymer to enable check of the state of the semiconductor wafer W housed in the aforementioned housing space, the semiconductor wafer W can be carried safely while the state of the semiconductor wafer W is checked.

The thin plate container 11 is different from a conventional housing container in which case the number of pieces that can be housed therein is predetermined and cannot be changed, and by setting the number of the loading trays 13 depending on the number of the semiconductor wafers W, it is possible to provide the thin plate container 11 with extremely high flexibility.

Also, after the thin plate container 11 is carried in a state where the entirety of it is integrally constrained, a loading tray 13 can be separated at an arbitrary position, and the semiconductor wafer W can be loaded out at the position to undergo specific processing. Consequently, plural loading trays 13 can be carried in a state of being integrally constrained, and a specific semiconductor wafer W can be selected from among the plural semiconductor wafers W housed inside to undergo processing. Thus, plural semiconductor wafers W having different processing contents can be carried in one thin plate container 11, and individual processing can be conducted to each semiconductor wafer W. Further, while one semiconductor wafer W is loaded in and out, the other semiconductor wafers W have no chance to be exposed in the external environment, and thus the other semiconductor wafers W can be kept clean.

Second Embodiment

Next, a second embodiment of the present invention will be described. As the entire structure of a thin plate container in the present embodiment is approximately the same as that of the thin plate container 11 in the aforementioned first embodiment, the same members are labeled with identical numerals, and the description of them is omitted.

Figure 8:
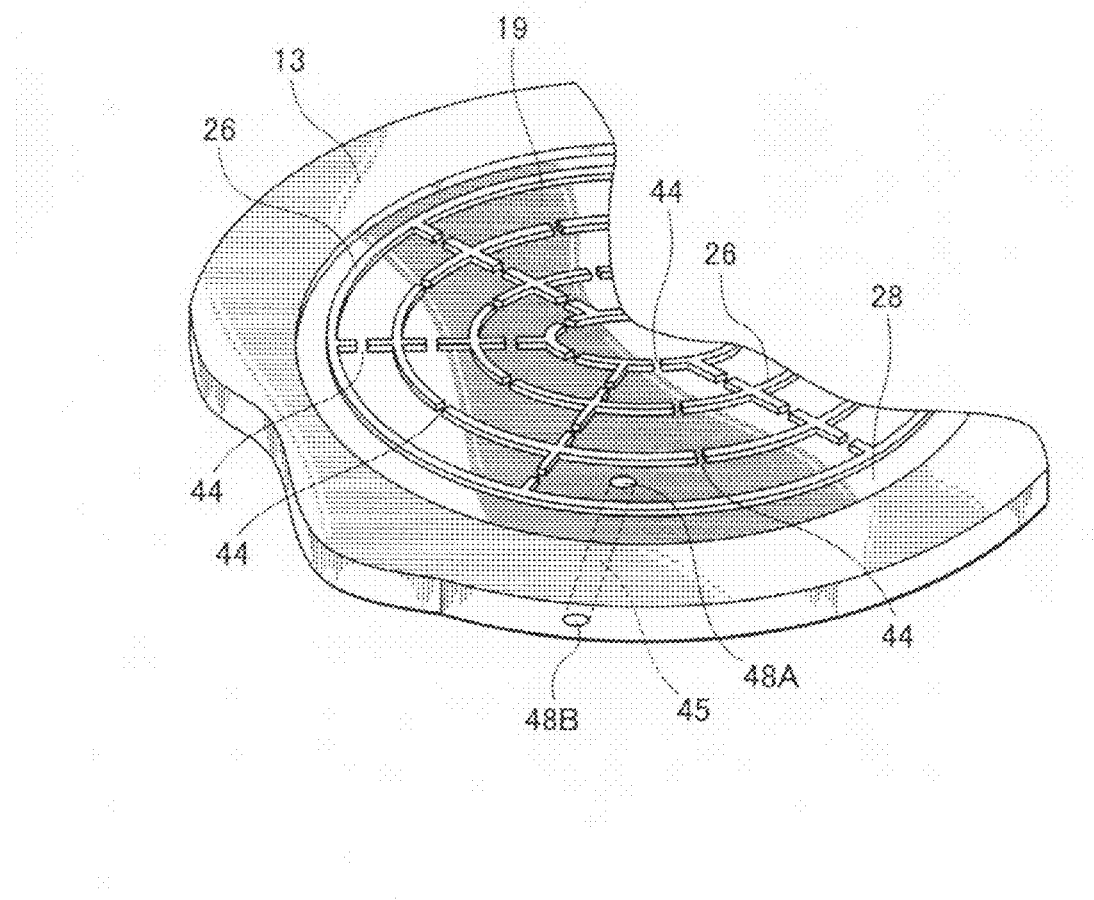
FIG. 8 is a perspective view of a loading tray of a thin plate container according to a second embodiment of the present invention shown from a second loading portion side.
Figure 9:
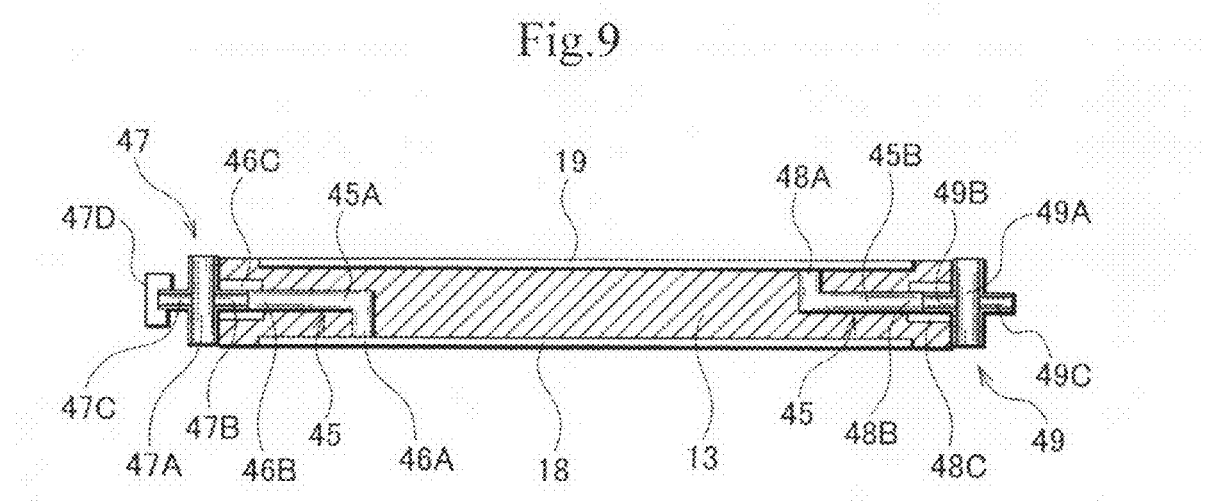
FIG. 9 is a lateral cross-sectional view showing the loading tray of the thin plate container according to the second embodiment of the present invention.
Figure 10A:
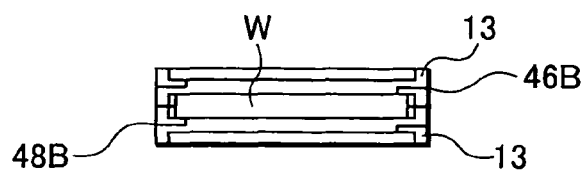
FIG. 10 is a schematic view showing an operation state of the thin plate container according to the second embodiment of the present invention.
Figure 10B:
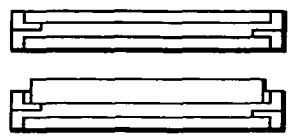
Figure 10C:
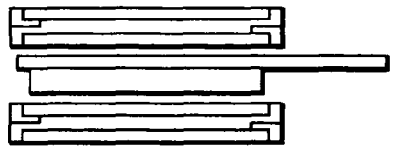
Figure 10D:
Figure 11A:
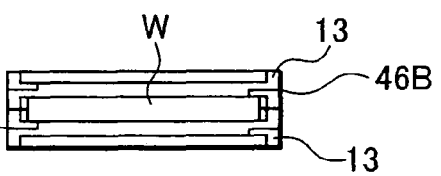
FIG. 11 is a schematic view showing an operation state of the thin plate container according to the second embodiment of the present invention.
Figure 11B:
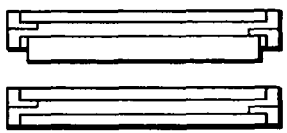
Figure 11C:
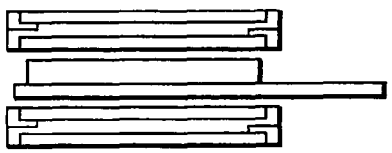
Figure 11D:
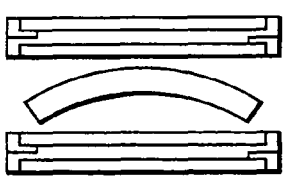

The thin plate container in the present embodiment is characterized by comprising a communication cutout 44 and a conduit 45, as shown in FIGS. 8 and 9.

The communication cutout 44 is a cutout to communicate with plural suction spaces partitioned by the web loading projection portion 26 provided on the second loading portion 19 of the loading tray 13 and the semiconductor wafer W when the loading projection portion 26 and the semiconductor wafer W abut to each other. Accordingly, air in one suction space partitioned by the loading projection portion 26 is sucked from the conduit 45, so that air in suction spaces partitioned by the loading projection portion 26 and communicated with one another is sucked so as to adsorb the semiconductor wafer W to the loading projection portion 26 side.

The communication by these communication cutouts 44 may range over all of the suction spaces or part of them. A communication space distributed to be able to adsorb the semiconductor wafer W by a uniform suction force is formed. The spaces partitioned by the aforementioned web loading projection portion 26 are communicated entirely, in a macular fashion, or in a doughnut shape so that the semiconductor wafer W can be adsorbed uniformly.

Two conduits 45 are provided in the loading tray 13. The conduits 45 consist of a first conduit 45A and a second conduit 45B. The first conduit 45A is provided to communicate the first loading portion 18 side of the loading tray 13 with the external environment. The second conduit 45B is provided to communicate the second loading portion 19 side of the loading tray 13 with the external environment.

As for the first conduit 45A, an outer opening 46A and an inner opening 46B are provided at its inner end and its outer end, respectively. The outer opening 46A is opened at an arbitrary position of the first loading portion 18. The inner opening 46B is opened from the circumferential wall of the loading tray 13 to the outside. The inner surface of the inner opening 46B is provided with a flexible tubular body 46C for connecting the inner opening 46B to a connection tube on the external apparatus in an air-tight manner. This flexible tubular body 46C is made of a synthetic resin or the like with flexibility. Thus, inserting the connection tube of the external apparatus or the like into the flexible tubular body 46C results in adhesion of this flexible tubular body 46C and the connection tube.

Herein, a first membrane filter 47 is attached to the flexible tubular body 46C. This first membrane filter 47 consists of a filter main body 47A, a connection tube 47B, and an external opening tube 47C. The connection tube 47B is inserted in the flexible tubular body 46C. In a case where no first membrane filter 47 is attached to the inner opening 46B, a cap (not shown) is attached to seal the housing space from the external environment. Also, there is a case where the housing space is sealed by the cap in a state where the semiconductor wafer W is adsorbed while the inside of the suction spaces is made to be in a negative-pressure state. Further, there is a case where a cap 47D is attached to the external opening tube 47C of the first membrane filter 47 to seal the housing space.

As for the second conduit 45B, an outer opening 48A and an inner opening 48B are provided at its inner end and its outer end, respectively, as in a similar manner to that of the first conduit 45A. The outer opening 48A is opened to one suction space partitioned by the loading projection portion 26 on the second loading portion 19. The inner opening 48B is opened from the circumferential wall of the loading tray 13 to the outside. The inner surface of the inner opening 48B is provided with a flexible tubular body 48C for connecting the inner opening 48B to a connection tube on the external apparatus in an air-tight manner, as in a similar manner to that of the inner opening 46B of the aforementioned first conduit 45A. This flexible tubular body 48C is made of a synthetic resin or the like with flexibility. A second membrane filter 49 is attached to the flexible tubular body 48C. This second membrane filter 49 consists of a filter main body 49A, a connection tube 49B, and an external opening tube 49C. This second membrane filter 49 has a cap (not shown) attached as needed, as in a similar manner to that of the aforementioned first membrane filter 47.

To suck air in the suction spaces from the conduits 45, a suction apparatus (not shown) is provided. Suction tubes (not shown) of this suction apparatus are attached to the inner openings 47B, 48B to suck air in the suction spaces.

[Operation]

The thin plate container configured as above is operated in the following manner.

As the general operation of the thin plate container 11 according to the present embodiment is similar to that of the aforementioned first embodiment, only characteristic aspects of the thin plate container 11 of the second embodiment will be described herein.

In the present embodiment, after the semiconductor wafer W is housed in the housing space constituted by the first loading portion 18, second loading portion 19, and seal material 24 of the loading tray 13, the suction tubes of the suction apparatus are inserted into the inner opening 46B and the inner opening 48B, and air is sucked from the first loading portion 18 and the second loading portion 19. Alternatively, the suction tubes of the suction apparatus are connected to the external opening tube 47C and the external opening tube 49C, respectively, in a state where the first membrane filter 47 and the second membrane filter 49 are attached, and air is sucked from the first loading portion 18 and the second loading portion 19.

Thus, on the first loading portion 18 side, its entire surface sucks the semiconductor wafer W, the space between the semiconductor wafer W and the first loading portion 18 is made to be in a negative-pressure state, and the semiconductor wafer W is sucked to the first loading portion 18 side.

On the second loading portion 19 side, air in the suction spaces is sucked from the outer opening 48A. At this time, due to the communication cutouts 44 of the loading projection portion 26, air in the entire suction spaces is sucked to cause the spaces to be in a negative-pressure state, and the semiconductor wafer W is adsorbed to the loading projection portion 26. The caps 47D are attached to the external opening tube 47C and the external opening tube 49C, respectively, to seal the inside.

In this manner, the semiconductor wafer W is adsorbed respectively to the first loading portion 18 side and the second loading portion 19 side to be supported reliably from the both sides. In this state, the thin plate container 11 is assembled.

After the thin plate container 11 is carried to a mechanical apparatus in accordance with each processing content, a loading tray 13 at an arbitrary position is separated, and the semiconductor wafer W therein is loaded out, as in a similar manner to that of the aforementioned first embodiment, and at this time, the operation specific to the present embodiment is performed.

[Effect]

Since the conduits 45 are provided to the loading tray 13 to suck air from the outside, and the semiconductor wafer W is adsorbed and constrained to the loading projection portion 26 and so on, the semiconductor wafer W can be constrained reliably and can be carried safely in cooperation with the operation of sandwiching and supporting the semiconductor wafer W from its both sides.

Since the communication cutouts 44 are provided at the aforementioned web loading projection portion 26 to communicate with plural spaces partitioned by the loading projection portion 26 and the semiconductor wafer W so as to enable uniform suction, and air in the communicated spaces is sucked via the conduits 45 to adsorb and constrain the semiconductor wafer W to the loading projection portion 26, each space partitioned by the loading projection portion 26 functions as a sucker, and thus the semiconductor wafer W can be constrained reliably and can be carried safely.

In a case where a semiconductor wafer W that warps due to a cause of inner stress or the like, such as an extremely thin semiconductor wafer W, is to be housed, it is sandwiched from both sides at its entire surfaces and is housed, and thus the semiconductor wafer W is formed in a flat shape at the time of housing. The semiconductor wafer W of the above type can be left open, keeping the flat state, by opening the loading tray 13 in a state where either side of the semiconductor wafer W is sucked. Further, when the loading tray 13 is opened, it is possible not only to prevent the semiconductor wafer W from jumping out by pressure reduction but also to make it easy to handle the semiconductor wafer W afterward.

Also, as suction is available from either side of the loading tray 13, the semiconductor wafer W can be loaded out, with a surface of the semiconductor wafer W to be processed directing upward, when the loading tray 13 is opened, and thus the subsequent processing is made to be easy, and the operability is improved.

Since the aforementioned loading trays 13 each having the conduits 45 for communicating the spaces partitioned by the loading projection portion 26 and the semiconductor wafer W with the external environment are inserted and stacked between the base trays 12, air is sucked from the outside via the conduits 45 of any one of the loading trays 13 to adsorb and constrain the semiconductor wafer W in its housing space to the loading projection portion 26, and the loading tray 13 at the arbitrary position is opened by releasing the constraint of the coupling/releasing means 14 to load out the adsorbed and constrained semiconductor wafer W, plural semiconductor wafers W housed in the thin plate container 11 can be constrained reliably and can be carried safely, and also the semiconductor wafer W at an arbitrary position can be loaded in/out safely.

By providing the inner surfaces of the inner openings opened to the external environment in the conduits 45 with the flexible tubular bodies 46C, 48C for air-tight connection to connection tubes on the external apparatus, filters can be inserted in and constrained to these flexible tubular bodies 46C, 48C easily, and thus each housing space can be opened to the external environment in a state of keeping the inside clean.

Third Embodiment

Next, a third embodiment of the present invention will be described. As the entire structure of a thin plate container in the present embodiment is approximately the same as that of the thin plate container 11 in the aforementioned first embodiment, the same members are labeled with identical numerals, and the description of them is omitted.

The thin plate container in the present embodiment is characterized by forming the flat surface shape of a loading tray 51 in an approximately square shape, as shown in FIGS. 13 to 17. It is also characterized by comprising a positioning cut-out 52, a tray positioning pin 53, and a tray positioning hole 54. It is noted that the tray positioning pin 53 and the tray positioning hole 54 constitute a displacement prevention means for preventing mutual displacement at the time of coupling of the loading trays 51.

Figure 14:
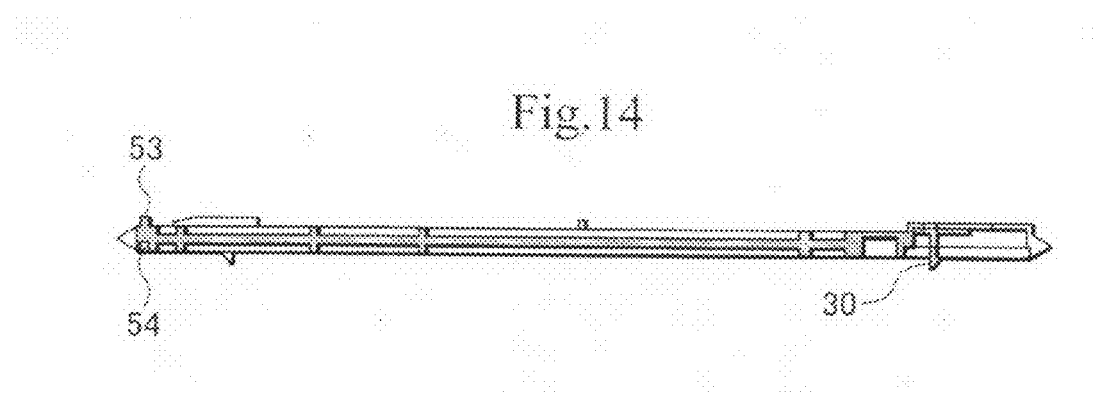
FIG. 14 is a lateral cross-sectional view showing the loading tray of the thin plate container according to the third embodiment of the present invention.
Figure 15:
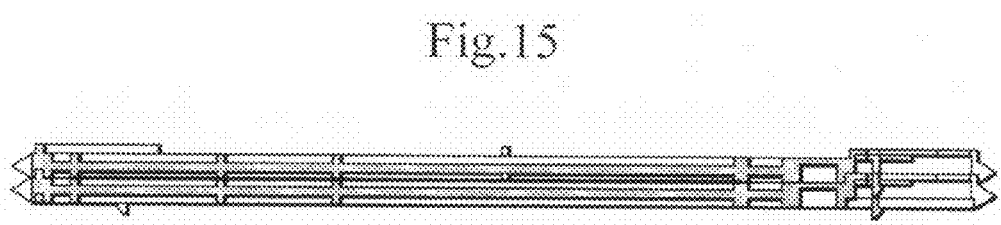
FIG. 15 is a lateral cross-sectional view showing the loading tray of the thin plate container according to the third embodiment of the present invention.

The flat surface shape of the loading tray 51 is formed in an approximately square shape, as shown in FIGS. 13 to 15. On the four corners of this loading tray 51, coupling/releasing means 14 are provided. The function of the coupling/releasing means 14 is similar to that of the coupling/releasing means 14 in the aforementioned first embodiment. On the two opposing sides of the loading tray 51 are provided grips 21. The function of this grip 21 is also similar to that of the grip 21 in the aforementioned first embodiment.

At the center of the grip 21, the positioning cut-out 52 is provided. This positioning cut-out 52 is a cut-out for positioning the loading tray 51 in the left-right direction. This positioning cut-out 52 is structured to have two slope surfaces sloped to each other. Specifically, it is structured as a V-shaped vertical cut-out at the grip 21. A positioning mechanism (not shown) on the mechanical apparatus is provided with a wedge-shaped portion to be fitted in the V-shaped positioning cut-out 52. Thus, in a state where supporting mechanisms 42 of carrier arms are fitted in the grips 21 to position the loading tray 51 in the up-down direction, the fitting portions of the positioning mechanisms are fitted in the positioning cut-outs 52 to position the loading tray 51 in the left-right direction.

In this manner, the loading tray 51 is positioned in the up-down direction by the grips 21 while the loading tray 51 is positioned in the horizontal direction by the positioning cut-outs 52, as in the operation of the aforementioned first embodiment. Accordingly, the loading tray 51 is positioned at a specific position in a three-dimensional space accurately, and the semiconductor wafer W is positioned accurately.

The tray positioning pin 53 is a pin for preventing displacement among the stacked loading trays 51. The tray positioning pin 53 is provided on the upper side of the loading tray 51. Specifically, four pins are provided at the center positions of the four sides of the square-shaped loading tray 51.

The tray positioning hole 54 is a conduit for being fitted to the tray positioning pin 53. The tray positioning hole 54 is provided at a position corresponding to each of the tray positioning pins 53. At the time of coupling of the stacked loading trays 51, the tray positioning pins 53 and the tray positioning holes 54 of the upper and lower loading trays 51 are mutually fitted to prevent displacement between the loading trays 51.

Thus, when the loading trays 51 are stacked, they can be stacked while each loading tray 51 is positioned accurately.

Also, a loading projection portion 55 of the loading tray 51 is formed in a double-ring shape. In addition, the loading projection portion 55 is provided on each of the first loading portion 18 side and the second loading portion 19 side. Accordingly, the semiconductor wafer W is sandwiched and supported by the upper and lower double loading projection portions 55.

Figure 16:
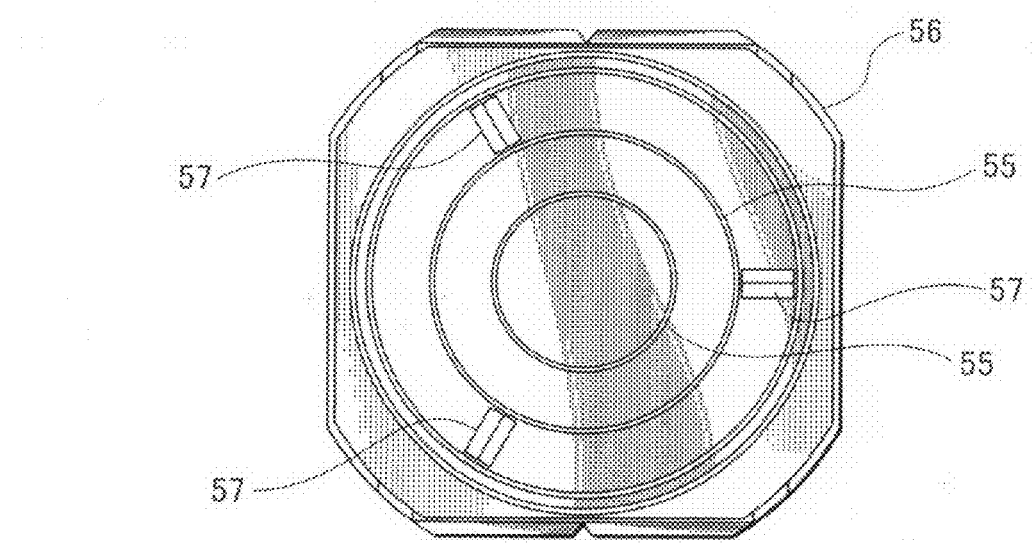
FIG. 16 is a plan view showing a base tray of the thin plate container according to the third embodiment of the present invention.
Figure 17:
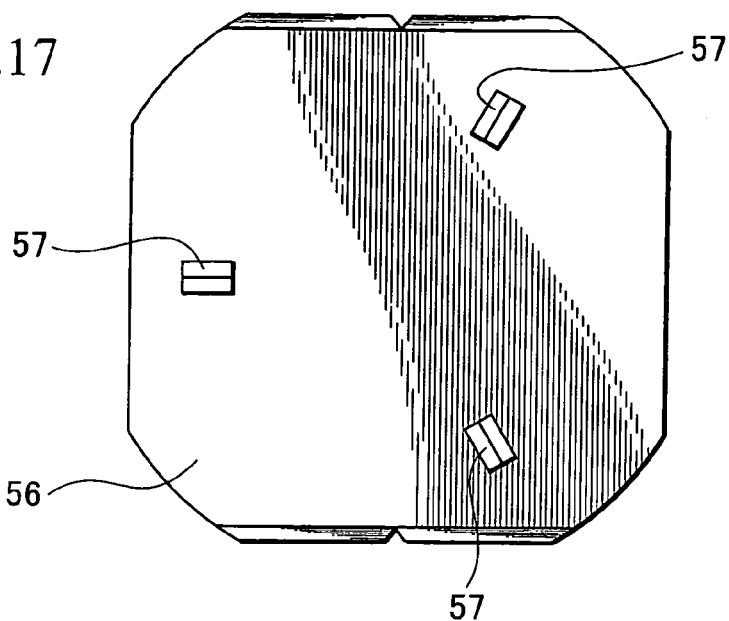
FIG. 17 is a plan view showing the base tray of the thin plate container according to the third embodiment of the present invention.

Base trays 56 are structured as shown in FIGS. 16 and 17. The entire shape is approximately the same as that of the loading tray 51. On an upper base tray 56A, three apparatus pin grooves 57 are provided. On a lower base tray 56B, the loading projection portion 55 and the apparatus pin grooves 57 are provided.

The above structure exerts operations and effects similar to those of the aforementioned first and second embodiments and enables positioning of the loading tray 51 in the left-right direction by the positioning cut-outs 52, thus to position the thin plate container at a specific position in a three-dimensional space accurately. As a result, when the semiconductor wafer W is transferred automatically by the mechanical apparatus, smooth transfer is enabled.

Also, the tray positioning pins 53 and the tray positioning holes 54 are provided to enable accurate positioning and stack of the loading trays 51. Further, the semiconductor wafer W can be sandwiched and supported reliably by the upper and lower double loading projection portions 55.

Figure 18:
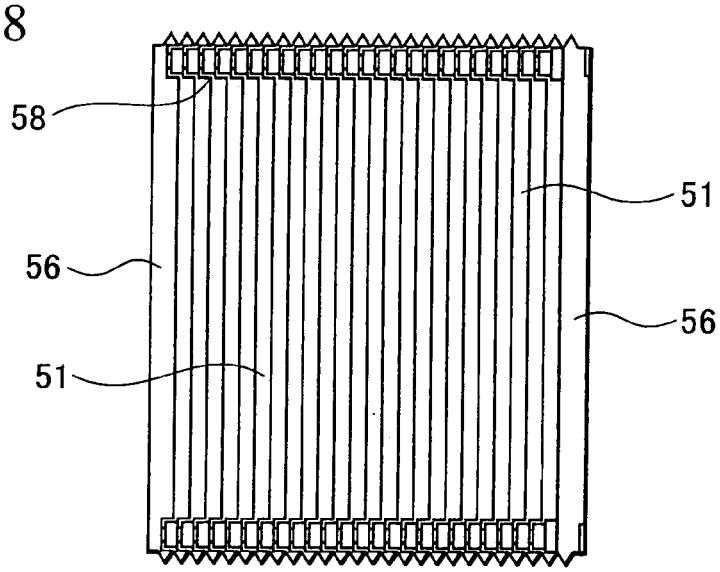
FIG. 18 is a side view showing a first modification example.

Meanwhile, instead of the tray positioning pins 53 and the tray positioning holes 54, a step 58 may be provided on the circumferential portion of the loading tray 51 as shown in FIG. 18. In this case as well, the loading trays 51 can be positioned and stacked accurately.

INDUSTRIAL APPLICABILITY

Although the grip 21 is formed in a wedge shape in each of the above embodiments, the shape is not limited to the wedge shape but may be another shape such as a cross-sectional trapezoid. The grip 21 just has to be structured to have two slope surfaces sloped to each other for positioning the loading tray 13 in the up-down direction.

Although the seal supporting groove 23 is provided on the first loading portion 18 of the loading tray 13, and the seal receiving groove 28 is provided on the second loading portion 19 in each of the above embodiments, they may be provided in reverse. They may be on the upper side or the lower side of the loading tray 13 as long as the embodiment enables the aforementioned housing space to be sealed off from the external environment and to be kept air-tight.

Although the loading projection portion 26 is provided on each of the first loading portion 18 and the second loading portion 19 in each of the above embodiments, it may be provided on either one. The loading projection portion 26 may be provided on either one or on each one depending on various conditions such as the dimension of the semiconductor wafer W.

Also, although the loading projection portion 26 is formed in a web state in each of the above embodiments, it may be in another shape such as an annular shape depending on the application. In this case as well, the shape of the loading projection portion 26 can be set depending on various conditions such as the dimension of the semiconductor wafer W.

Figure 19:
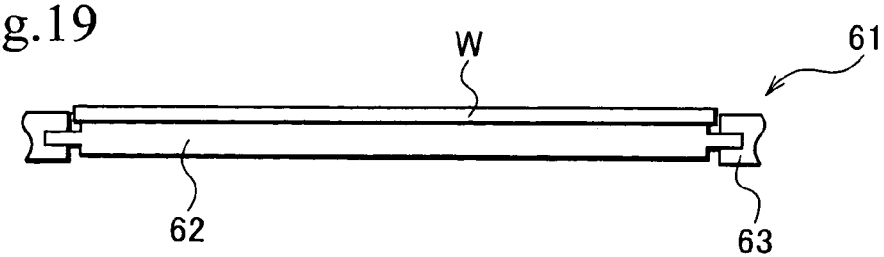
FIG. 19 is a side view showing a second modification example.
Figure 20:
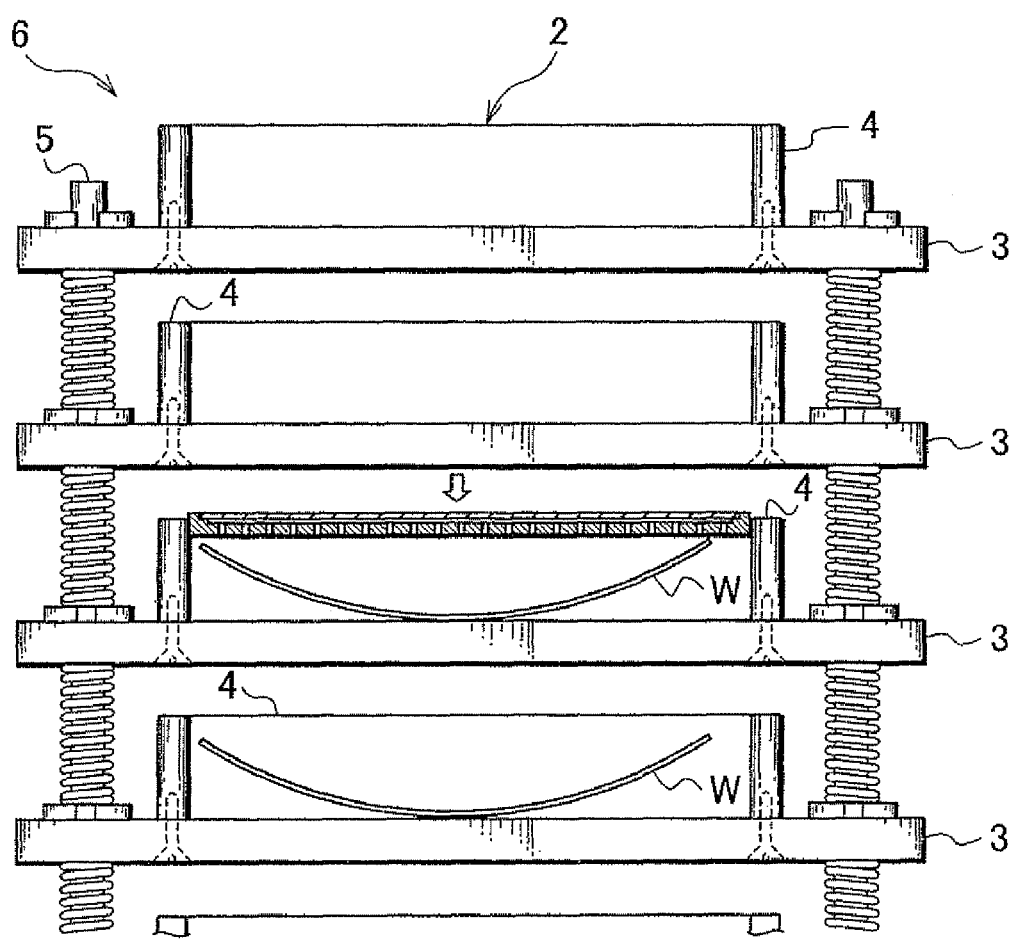
FIG. 20 is a front view showing a conventional thin plate container.

Although the loading tray 13 is constituted as one member in each of the above embodiments, it may be made of partially different materials. For example, as shown in FIG. 19, a loading tray 61 may be constituted by a loading plate portion 62 consisting of the first loading portion 18 and the second loading portion 19 and a loading tray main body 63 fitted to the circumference of the loading plate portion 62 to support it, and the loading plate portion 62 and the loading tray main body 63 may be made of different materials from each other. In such a case, at least the aforementioned loading tray main body 63 is preferably made of an ESD or conductive polymer. Also, the loading plate portion 62 can be made of various kinds of materials such as a softer material than the semiconductor wafer W, a transparent material, and so on.

Thus, it is possible to prevent dust from attaching to the surface of the semiconductor wafer W, and the semiconductor wafer W can be kept clean. Also, in a state where the function of keeping the semiconductor wafer W clean is supported, the loading plate portion 62 can be made of various kinds of materials. Consequently, in a state where the function of keeping the semiconductor wafer W clean is provided to the loading tray main body 63 side, which is a basic function, various functions can be provided to the loading plate portion 62 side, and thus the loading tray 61 can be a tray having various functions and can be used for various applications in accordance with the functions.

Although the first membrane filter 47 and the second membrane filter 49 are provided on the circumferential wall of the loading tray 13 in each of the above embodiments, they may be provided inside the conduits 45. In this conduit 45, at least one air cleaning filter may be attached to a position from the outer opening on the first loading portion 18 side or the second loading portion 19 side of the loading tray 13 to the inner opening on the external environment.

This resolves a state where another member is attached around the loading tray 13 and enables compact housing of the dust filter without taking much space.

Also, in the aforementioned conduit 45, an air cleaning filter consisting of a pair of dust filters and a chemical filter provided between the pair of dust filters may be attached to a position from the outer opening on the first loading portion 18 side or the second loading portion 19 side of the loading tray 13 to the inner opening on the external environment. The aforementioned dust filters are preferably membrane filters.

This leads to compact housing of the air cleaning filter and elimination of chemical substances, and the housing space can be opened to the external environment in a state of keeping a clean state.

Also, since using membrane filters as the aforementioned dust filters enables the dust filters to constitute a compact air cleaning filter with the chemical filter inbetween, the filters do not have to take much space, and the housing space can be communicated to the external environment through the filter in a state of keeping a clean state.

Although each of the above embodiments has been described taking a case of using a 300 mm semiconductor wafer W as a thin plate as an example, the thin plate can be in any size. For example, in a case where a semiconductor wafer W with a small diameter is used that is easy to break in a case where the thickness is extremely thin, applying the present invention will exert operations and effects similar to those of the aforementioned embodiments.

Also, the thin plate container 11 is loaded in a vertical direction to be divided in the up-down direction in the aforementioned embodiments, it may be loaded in an oblique direction or in a horizontal direction as needed, followed by separation. For example, in testing phases of a glass substrate for liquid crystal, the glass substrate for liquid crystal is tested in a state of being inclined in some cases, along with which case the thin plate container 11 may be inclined.

Although the grip 21 and the positioning cut-out 52 are set in a V shape in the aforementioned embodiments, the shape is not limited to the V shape but may be another shape such as a U shape as long as the shape enables accurate positioning.

The invention claimed is:

1. Stackable loading trays, each loading tray supporting at least one thin plate and comprising:

a first loading portion, provided on one side of the loading tray, on which at least one thin plate is supported;

a second loading portion, provided on a second side of the loading tray, opposite the one side, and fitted to the first loading portion of an adjacent loading tray to form a housing space sealed off from the external environment, for sandwiching at least one thin plate within the housing space, and for supporting the thin plate on said loading tray when the loading tray is placed upside-down;

a loading projection, provided projecting from at least one of first loading portion and the second loading portion, and directly contacting and supporting a thin plate, over its entire surface, within the housing space;

a coupling portion, provided on one of the sides of the loading tray, for coupling with an adjacent loading tray; and a coupled portion, provided on another side of the loading tray, for coupling with the coupling portion of an adjacent loading tray, wherein each thin plate is housed in a housing space created by stacking the loading trays and is supported in the housing space the loading trays from both upper and lower sides.

2. The loading tray according to claim 1, wherein the loading projection is web is a loading projection web formed in the shape of a web extending over the entire surface of at least one of the first loading portion and the second loading portion so as to contact a minimum area of the thin plate.

3. The loading tray according to claim 1, comprising:
   a conduit for in communication with a space partitioned by the loading projection and closed by the thin plate and in communication with the external environment when the loading projection and the thin plate abut each other.

4. The loading tray according to claim 2, wherein the loading projection web divides spacing, between the loading portion from which it projects and a thin plate, into plural partitioned spaces, and wherein segments of the loading projection web have communication cutouts providing communication between the plural partitioned spaces when the loading projection and the thin plate abut each other.

5. The loading tray according to claim 3, wherein said conduit is a first conduit providing communication between a space, formed by the first loading portion and the thin plate, and the external environment or a second conduit providing communication between a space, formed by the second loading portion and the thin plate, and the external environment.

6. A thin plate container, comprising a pair of base trays for engaging with a mechanical apparatus, one or more loading trays inserted between the base trays for housing thin plates, and a coupling/releasing means for providing coupling between the loading trays and between the base trays and the loading trays, and for releasing a coupling at an arbitrary position independently of other couplings,
   wherein each of the loading trays comprises:
   a first loading portion, provided on one side of the loading tray, on which at least one thin plate is loaded;

a second loading portion, provided on a second side of the loading tray, opposite the one side, and fitted to the first loading portion of an adjacent loading tray to form a housing space sealed off from the external environment, for sandwiching the thin plate within said housing space, and for supporting the thin plate on the loading tray when the loading tray is placed upside-down;

a loading projection, provided projecting from at least one of first loading portion and the second loading portion, and directly contacting and supporting a thin plate, over its entire surface, within the housing space;

a coupling portion of the coupling/releasing means, provided on the second side of the loading tray for coupling with an adjacent loading tray or base tray; and a coupled portion of the coupling/releasing means for engaging a coupling portion of an adjacent loading tray or tray, wherein each thin plate is housed in a housing space created by stacking the one or more loading trays between the pair of base trays and is supported within the one housing space from both upper and lower sides.

7. The thin plate container according to claim 6, further comprising:

a seal material on a surface of a loading portion, surrounding the housing space, for isolating the housing space from the external environment and for keeping the housing space air-tight.

8. The thin plate container according to claim 7, wherein a seal supporting groove for supporting the seal material is formed on a side of each loading tray, surrounding a loading portion, and wherein a seal receiving groove for abutting the seal material, to provide air-tightness is formed in an opposing side of each said loading tray.

9. The thin plate container according to claim 6, wherein the loading projection is formed in the shape of a web extending over the entire surface of at least one of the first loading portion and the second loading portion so as to contact a minimum area of the thin plate.

10. The thin plate container according to claim 6, wherein each loading tray has a conduit in communication through an outer opening with a space partitioned by the loading projection and closed by the thin plate and in communication at an inner opening, with the external environment when the loading projection and the thin plate abut each other.

11. The thin plate container according to claim 9, wherein the loading projection web divides spacing between the loading portion from which it projects and a thin plate, into plural partitioned spaces, and wherein segments of the loading projection web have communication cutouts providing communication between the plural partitioned spaces when the loading projection and the thin plate abut each other.

12. The thin plate container according to claim 10, wherein the conduit is a first conduit providing communication between a space, formed by the first loading portion and the thin plate, and the external environment and a second conduit providing communication between a space, formed by the second loading portion and the thin plate, and the external environment.

13. The thin plate container according to claim 10, wherein the inner surface of the inner opening in the conduit is provided with a flexible tubular body for air-tight connection to an external apparatus.

14. The thin plate container according to claim 10, wherein at least one air cleaning filter is attached to the conduit outer opening on the loading surface side of each said loading tray and to the conduit inner opening on the external environment side.

15. The thin plate container according to claim 10, wherein at least one air cleaning filter is attached to the conduit outer opening on the loading surface side and to the conduit inner opening on the external environment side, and wherein each air cleaning filter is a pair of dust filters and a chemical filter sandwiched between said pair of dust filters.

16. The thin plate container according to claim 15, wherein said dust filters are membrane filters.

17. The thin plate container according to claim 6, wherein each loading tray has information recording/replaying means for recording and reading out management information pertaining to either or both of the loading tray itself and the thin plate supported on the loading tray.

18. The thin plate container according to claim 17, wherein the information recording/replaying means comprises a wireless tag or a barcode.

19. The thin plate container according to claim 6, wherein an infopad is provided on base tray for displaying various kinds of management information on the base tray.

20. The thin plate container according to claim 6, wherein each loading tray is made of an electrostatic discharge or conductive polymer.

21. The thin plate container according to claim 6, wherein each loading tray comprises the first and second loading portions and a loading tray main body for supporting the first and second loading portions around their circumferences, wherein the first and second loading portions are made of materials different from the loading tray main body, and at least the loading tray main body is made of an electrostatic discharge or conductive polymer.

22. The thin plate container according to claim 6, wherein said loading portion is made of a polymer which is softer and more flexible polymer than the thin plate.

23. The thin plate container according to claim 6, wherein at least a portion of each loading tray is made of a transparent polymer.

24. The thin plate container according to claim 6, wherein at least a portion of a loading portion is made of a transparent polymer.

* * * * *